(12) United States Patent
Tohyama et al.

(10) Patent No.: US 6,515,309 B1
(45) Date of Patent: Feb. 4, 2003

(54) LED ARRAY CHIP

(75) Inventors: Hiroshi Tohyama, Tokyo (JP); Susumu Ozawa, Tokyo (JP); Yuko Kasamura, Tokyo (JP); Satoru Yamada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/472,349

(22) Filed: Dec. 27, 1999

(30) Foreign Application Priority Data

Dec. 25, 1998 (JP) .............................. 10-368823

(51) Int. Cl.[7] .................. H01L 33/00; H01L 21/00; H01L 21/301; H01L 21/46; H01L 21/78
(52) U.S. Cl. .............................. 257/88; 438/33; 438/68; 438/462
(58) Field of Search .............................. 257/79, 81, 88, 257/910, 45; 438/33, 68, FOR 386, 39, 40, 460, 461, 462, 463, 464, 465

(56) References Cited

U.S. PATENT DOCUMENTS 4,019,248 A * 4/1977 Black .......................... 257/496
4,851,371 A * 7/1989 Fisher et al. .......... 148/DIG. 28
6,165,815 A * 12/2000 Ball .............................. 438/113

FOREIGN PATENT DOCUMENTS

JP          06-188311       * 8/1994 ............ H01L/21/78

* cited by examiner

Primary Examiner—Olik Chaudhuri
Assistant Examiner—Timothy Sutton
(74) Attorney, Agent, or Firm—Akin Gump Strauss Hauer & Feld, L.L.P.

(57) ABSTRACT

An LED array chip comprises a semiconductor substrate having a front surface and a side surface. The first surface and the front surface come together at an end of the chip to define an end portion of said semiconductor substrate that has an acute angle between the first surface and the front surface. The end of the chip defines an outermost dimension of the chip. The first surface extends further away from the front surface than the diffuison depth of the light emitting elements. A method of manufacturing an LED array chip includes the steps of: forming grooves between adjacent LED arrays of the plurality of LED arrays, each of the grooves having opposing side walls each of which makes an acute angle with the front surface; and dicing the semiconductor wafer except for the opposing side walls of each of the grooves to separate the plurality of LED arrays into individual LED array chips.

10 Claims, 22 Drawing Sheets

WHEN $\theta 1 < \theta 2$, $L1 < L2$

WHEN $D1 < D2$, $L3 < L4$

DIRECTION OF DICING

DIRECTION OF DICING

MARGIN OF BLADE POSITION $W_1 < W_2$

DIRECTION OF DICING

LEDs NEAR MIDDLE OF WAFER

LEDs NEAR PERIPHERY OF WAFER

DIRECTION OF DICING

LED ARRAY CHIP

BACKGROUND OF THE INVENTION

1. Field of the Invention

This invention relates to an LED array chip having a plurality of light-emitting elements (e.g., LEDs) and a method of manufacturing the LED array chip, and a dicing apparatus that separates a plurality of LED arrays into individual chips.

2. Description of the Related Art

FIGS. 26A–26C illustrate the construction of a conventional LED array.

FIG. 26A is a top view of a semiconductor wafer on which a plurality of LED arrays 100 are formed.

FIG. 26B is a top view of one of LED arrays 100 after the semiconductor wafer has been diced.

FIG. 26C is a cross-sectional view of the LED array 100 taken along lines D–D' of FIG. 26B.

FIGS. 27A and 27B illustrate the steps of the dicing process when a conventional LED array is diced.

The LED array chip 100 includes primarily a plurality of light-emitting elements (p-type diffusion region) 5, a plurality of individual electrodes 9, and a common electrode 3, all being formed on an n-type semiconductor substrate 1. The light-emitting elements 5 are formed in a row on the surface of the n-type substrate 1 at predetermined intervals of, for example, 600 dpi or 1200 dpi. The individual electrodes 9 are formed such that a part of the electrode 9 is in contact with a part of the light-emitting element 5. Each LED consists of the light-emitting element 5, individual electrode 9, n-type substrate 1, and common electrode 3.

The semiconductor wafer is diced using a dicing apparatus shown in FIG. 6, so that the plurality of LED arrays 100 are separated into individual chips.

The dicing process will be described with reference to FIGS. 6, 7, and 27.

A semiconductor wafer 20 on which a plurality of LED arrays are formed is fixedly attached to a dicing tape 24. Then, the semiconductor wafer 20 attached on the dicing tape 24 is fixed on a stage 21 of the dicing apparatus by using a fixing jig 25. A dicing path 101 among adjacent LED arrays 100 on the semiconductor substrate 1 is located by using a CCD camera having a magnifying lens. Then, a diamond blade 22 is positioned to cut the semiconductor wafer 20. As shown in FIG. 27A, the diamond blade 22 moves across the semiconductor wafer 20 along one of two opposed lateral ends of the dicing path 101. Then, the semiconductor wafer 20 is turned around through 180 degrees in a horizontal plane and the diamond blade 22 moves across the semiconductor wafer 20 along the other of the lateral ends of the dicing path 101. Therefore, each LED array chip is of an inverted trapezoidal shape as shown in FIG. 26C. LED array chips of an inverted trapezoidal shape are disclosed in, for example, Japanese Patent Preliminary Publication (KOKAI) No. 2-10879.

FIG. 28A illustrates a rectangular cross-sectional view of another conventional LED array chip 102.

FIG. 28B shows an LED array chip 103 having a cross section of an inverted trapezoid.

The conventional LED arrays chips shown in FIGS. 26C and 28A have endmost light emitting elements close to the diced edges of the chips. Thus, chipping or cracks occur in the diced surface so that the endmost light emitting element is subject to deterioration of characteristics, e.g., leakage of light. In order to eliminate this drawback, a distance Ls between the light emitting element and the chip edge should be increased. For example, with an LED printhead, a plurality of LED array chips are arranged in a row such that the distance between endmost light emitting elements of adjacent chips must be equal to the distance between adjacent light emitting elements in each chip. Increasing the distance Ls is an obstacle to implementing high density construction of the LED printhead. Accordingly, a need exists in the art for LED array chips having shorter distance Ls.

FIG. 28B shows still another LED array chip 103 of an inverted trapezoidal cross section with beveled surfaces 104 formed at the corners of the n-type substrate 1. The semiconductor wafer is subjected to an etching process to form grooves in the dicing paths having walls at an obtuse angle with the chip surface. Then, the semiconductor wafer is diced as shown in FIG. 27, so that the LED arrays are separated into individual chips. The beveled surfaces 104 are etched surfaces and form a surface portion of the chip of a mesa shape.

For the conventional LED array chips having a mesa shape shown in FIG. 28B, if the LED arrays are to be of high resolution (e.g. 1200 dpi), then the distance Ls must be still shorter. However, a shorter distance Ls again presents the problem of deteriorated characteristics such as leakage light.

The outermost dimensions of the conventional LED arrays are subjected to dicing errors (e.g., about ±4.5 μm) when the wafer is diced into individual chips using a dicing apparatus. Therefore, there are variations in the distance Ls between the endmost light emitting element and the outermost edge of the chip. Variations in the distance Ls give rise to variations in the distance between endmost LEDs of adjacent LED array chips when the LED array chips are assembled into an LED printhead.

SUMMARY OF THE INVENTION

An object of the present invention is to provide an LED chip where the light emitting elements do not deteriorate and are densely aligned.

Another object of the invention is to provide an LED chip which minimizes variations of the distance between the endmost light emitting element and the end of the chip is minimized.

An LED array chip comprises a semiconductor substrate having a front surface, a back opposing the front surface, and a side surface between the front surface and the back surface. The front surface is formed with a row of light emitting elements formed therein. The side surface has a first surface formed by etching the substrate. The first surface and the front surface come together at an end of the chip to define an end portion of the semiconductor substrate that has an acute angle between the first surface and the front surface. The end of the chip defines an outermost dimension of the chip.

The first surface extends further away from the front surface than the diffusion depth of the light emitting elements. The side surface includes a second surface that extends from the first surface to the back surface. The second surface makes substantially right angle or an obtuse angle with the back surface. The second surface is a diced surface.

A method of manufacturing an LED array chip comprising the steps of:

forming a plurality of LED arrays on a semiconductor wafer that has a front surface and a back surface opposing the front surface, the plurality of LED arrays being formed in the front surface;

forming grooves between adjacent LED arrays of the plurality of LED arrays, each of the grooves having a length extending to partition adjacent LED arrays, each of the grooves having opposing side walls each of which makes an acute angle with the front surface; and dicing the semiconductor wafer except for the opposing side walls of each of the grooves to separate the plurality of LED arrays into individual LED array chips, the semiconductor wafer being diced such that each of the individual LED array chips has a diced surface at substantially right angle or an obtuse angle with the back surface and the diced surface extends from each of the side walls to the back surface.

The first surface of the side surface extends further away from the front surface than the diffusion depth of the light emitting elements formed in the front surface of the semiconductor wafer.

The obtuse angle is given by $\theta b \leq 180° - \theta a$, where $\theta a$ is the acute angle and $\theta b$ is the obtuse angle.

The grooves have a depth given by $D \geq 2H \cdot \cot(\theta b - 90)$ where D is the depth, H is a dicing error, and $\theta b$ is the obtuse angle.

The method may further include the step of forming a target pattern on the back surface of the semiconductor wafer, the target pattern being positioned with respect to each of the grooves;

wherein the dicing the semiconductor wafer includes the steps of:

fixing the semiconductor wafer on a stage of a dicing apparatus such that the front surface of the semiconductor wafer is closer to the stage than the back surface of the semiconductor wafer;

detecting the target pattern using a camera positioned over the stage; and dicing the semiconductor wafer along each of the grooves with reference to the target pattern.

The target pattern is an opening formed by patterning an electrically conductive layer formed on the back surface of the semiconductor wafer, the opening being aligned with each of the grooves.

The grooves have a depth given by $D \geq 2H + Dp$ where D is the depth, H is a dicing error, and Dp is a depth of the light emitting elements.

A dicing apparatus for dicing a semiconductor wafer has a front surface and a back surface that opposes the front surface, the front surface having a plurality of elements and dicing target patterns formed therein. The dicing apparatus comprises:

a transparent stage having a front side and a back side, the front side supporting the semiconductor wafer thereon with the front surface being closer to the stage than the back surface;

a dicing blade facing the front side and dicing the semiconductor wafer at the dicing patterns from the back surface to the front surface into individual chips; and a camera that detects the dicing target pattern through the stage.

The semiconductor wafer may be attached to a transparent dicing tape and is fixed on the stage with the transparent dicing tape facing the stage.

A dicing apparatus for dicing a semiconductor wafer has a front surface and a back surface that opposes the front surface, the front surface having a plurality of elements and a dicing target pattern formed therein. The dicing apparatus comprises:

a stage supporting the semiconductor wafer thereon with the front surface of the semiconductor wafer being closer to the stage than the back surface;

a dicing blade facing the stage and dicing the semiconductor wafer at the dicing patterns from the back surface to the front surface into individual chips; and an infrared camera that shoots the back surface of the semiconductor wafer to detect the dicing target pattern through the semiconductor wafer.

A dicing apparatus for dicing a semiconductor wafer has a front surface and a back surface that opposes the front surface, the front surface having a plurality of elements and a dicing target pattern formed therein. The dicing apparatus comprises:

a stage supporting the semiconductor wafer thereon, the semiconductor wafer having the front surface attached to a dicing tape, the dicing tape directly facing the stage, the stage having at least one hole through which the dicing tape is vacuum-sucked to the stage;

an infrared camera that shoots the back surface of the semiconductor wafer on the stage to detect the dicing target pattern through the semiconductor wafer.

a dicing blade facing the back surface of the semiconductor wafer and dicing the semiconductor wafer at the dicing patterns from the back surface to the front surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

Preferred embodiments of the invention will be described in detail with reference to the accompanying drawings.
First Embodiment FIGS. 1A–1F are cross-sectional views, illustrating the manufacturing steps of LED arrays according to a first embodiment of the invention.

FIGS. 1A–1D illustrate the steps of fabricating the LED arrays on a semiconductor wafer.

Figure 1A:
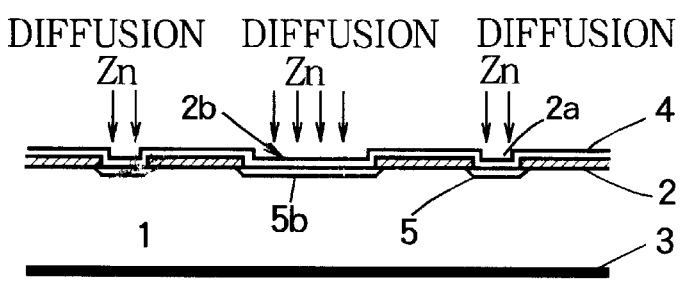
FIGS. 1A–1D illustrate the steps of fabricating the LED arrays according to the first embodiment.
Figure 1B:
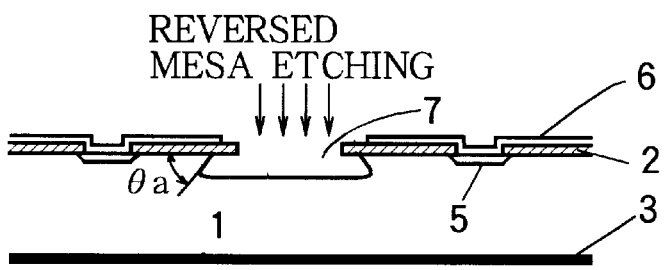
Figure 1C:
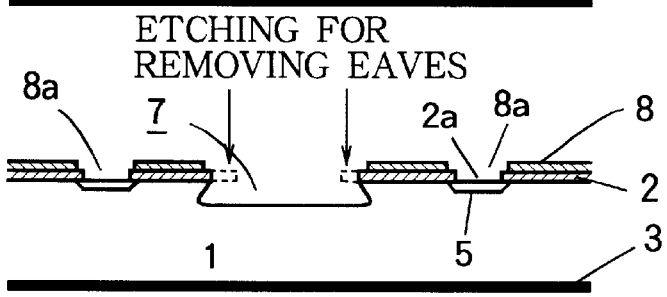
Figure 1D:
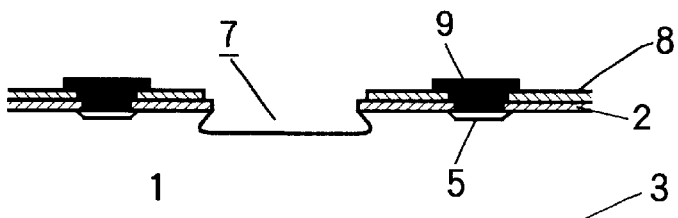
Figure 1E:
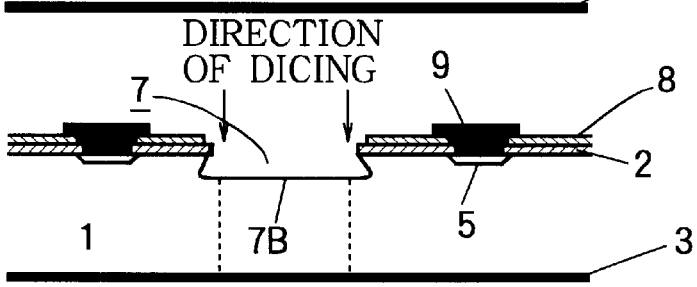
FIGS. 1E and 1F illustrate the steps of the dicing process according to the first embodiment in which the semiconductor wafer is cut into individual LED array chips.
Figure 1F:
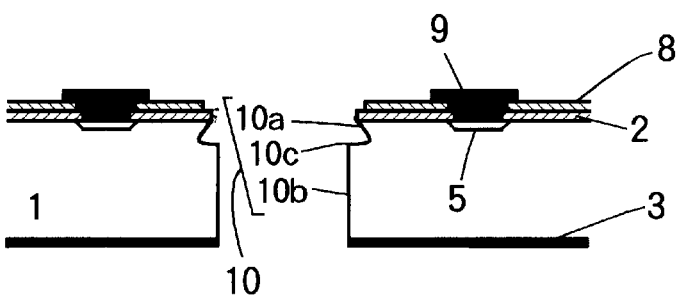

FIGS. 1E–1F illustrate the steps of the dicing process in which the wafer is cut into individual LED array chips.

As shown in FIG. 1A, a diffusion-preventing layer 2 is formed on an n-type substrate (i.e., n-type semiconductor wafer) 1. The n-type substrate 1 is formed by epitaxially growing an n-type GaAsP (gallium-arsenic-phosphor) layer on an n-type GaAs wafer. Then, openings 2a and 2b are formed in the diffusion-preventing layer 2 by photolithography and etching, or lift-off technique. For simplicity, FIGS. 1A–1F show only endmost openings 2a of adjacent LED arrays and the opening 2b between the endmost openings 2a. The openings 2a are used to define light-emitting elements and the opening 2b is used to define separation groove between the adjacent LED arrays. The diffusion-preventing layer 2 is in the form of alumina film, nitride film, or silicon oxide having a thickness ranging from 50 to 100 nm, and is formed by evaporation, sputtering, or chemical vapor deposition. An n-side electrode (common electrode) 3 is formed on a back side of the n-type substrate 1. The n-side electrode 3 is an electrode of gold and conducts current away from the n-type substrate 1.

Then, a diffusion control film 4 is formed on the diffusion-preventing layer 2. The diffusion control film 4 is formed by evaporation, sputtering, or chemical vapor deposition, and is in the form of alumina film, nitride film, silicon oxide, or PSG film having a thickness in the range of 10–20 nm.

A p-type impurity such as Zn (zinc) is diffused into the n-type substrate 1 through the diffusion controlling film 4 by vapor phase diffusion, thereby forming a p-type diffusion region (light emitting element) 5 in the n-type substrate 1 under the opening 2a and a p-type diffusion region 5b under the opening 2b. The p-type diffusion regions 5 and 5b are p-type GaAsP regions. Through the aforementioned steps, the p-type diffusion regions 5 and 5b are formed in the front surface side of the n-type substrate 1. Thereafter, the diffusion control film 4 is removed by, for example, etching.

As shown in FIG. 1B, a photo resist 6 is formed on the opening 2a to protect the opening 2a. Then, the p-type diffusion region 5b and a part of the n-type substrate 1 under the opening 2b is etched by wet etching, thereby forming a separation groove 7 having a cross-section of a reverse mesa shape. Subsequently, the photo resist 6 is removed. The side walls of the separation groove 7 make acute angles θa with the front surface of the n-type substrate 1.

The angle θa is determined by the crystal axis of the n-type substrate 1. Therefore, the n-type substrate 1 is selected from among substrates having crystal axes such that the angle θa is an acute angle. In order to obtain an n-type substrate having a desired crystal axis, an n-GaAs wafer is cut such that the front surface of the wafer has a desired crystal axis and then an n-GaAsP layer is grown by epitaxy on this n-GaAs wafer. Sulfuric acid type etchant or fluoric acid type etchant is used. Dry etching may also be used to form the separation groove 7, provided that the separation groove 7 of a reverse mesa shape can be formed.

Then, as shown in FIG. 1C, the photo resist 6 is removed and the eaves-like diffusion-preventing layer 2 that extends over the separation groove 7 is removed by etching. Then, an insulating film 8 is formed on the diffusion-preventing layer 2. By photolithography and etching, or lift-off technique, an opening 8a is formed in the insulating film 8 such that the opening 2a is completely in the opening 8a and the does not extend to the perimeter of the opening 8a. The insulating film 8 takes the form of an alumina film, nitride film, or silicon oxide having a thickness in the range of 50–100 nm, and is formed by evaporation, sputtering, or chemical vapor deposition.

As shown in FIG. 1D, a p-side electrode 9 is formed by sputtering (or evaporation) and photolithography (or lift-off technique). The p-side electrode is in ohmic contact with a part of the surface of the p-type diffusion region (light emitting element) 5. The p-side electrode 9 is an electrode of, for example, aluminum for supplying current to the p-type diffusion region 5.

Then, as shown in FIGS. 1E and 1F, the n-type substrate 1 is diced along the separation groove 7 into individual LED array chips. The n-type substrate 1 is diced in a direction normal to the front surface of the n-type substrate 1, from the bottom of the separation groove 7 to the back surface of the n-type substrate 1. In the following description, LED arrays diced into individual chips are referred to as "LED array chips". After dicing, each of the side surface of the LED array chips includes an etched surface 10a and a diced flat surface 10b. The etched surface 10a of a reverse mesa shape makes an acute angle with the front surface of the LED array chip. The diced flat surface 10b is at right angles with the back surface of the LED array chip. The etched surface 10a and the end of the diced surface 10b come together at the edge 10c to define the outermost dimension of the LED array chip.

The dicing process of the LED arrays according to the first embodiment will now be described.

Figure 2A:
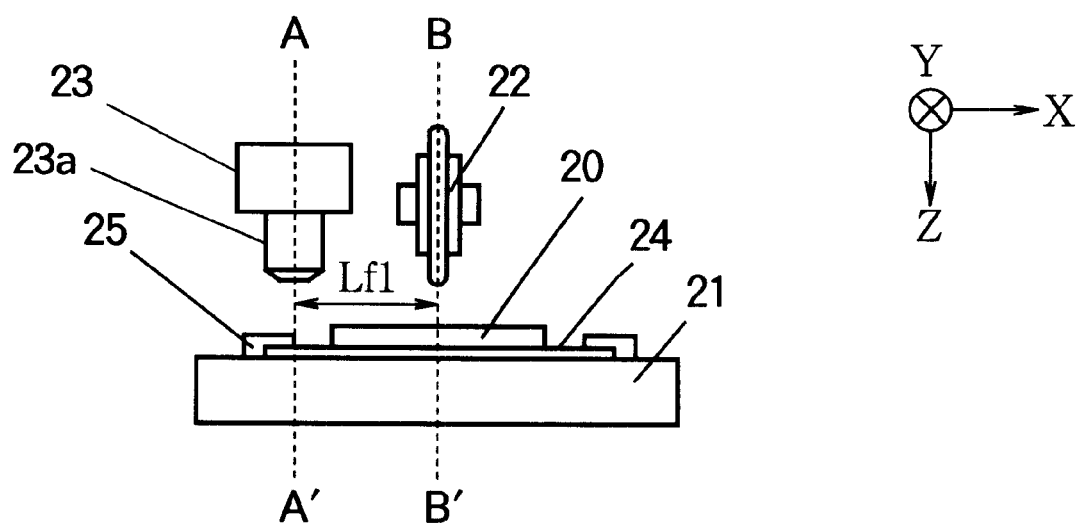
FIGS. 2A and 2B illustrate the general construction of a dicing apparatus used for dicing the LED array, FIG. 2A being a front view and FIG. 2B being a side view.
Figure 2B:
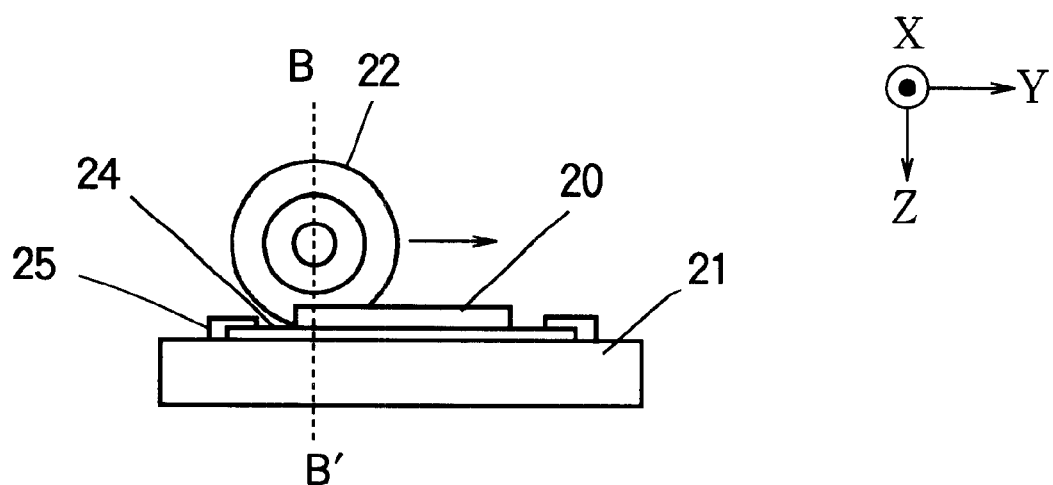

FIGS. 2A and 2B illustrate the general construction of a dicing apparatus used for dicing the LED array, FIG. 2A being a front view and FIG. 2B being a side view.

Figure 3A:
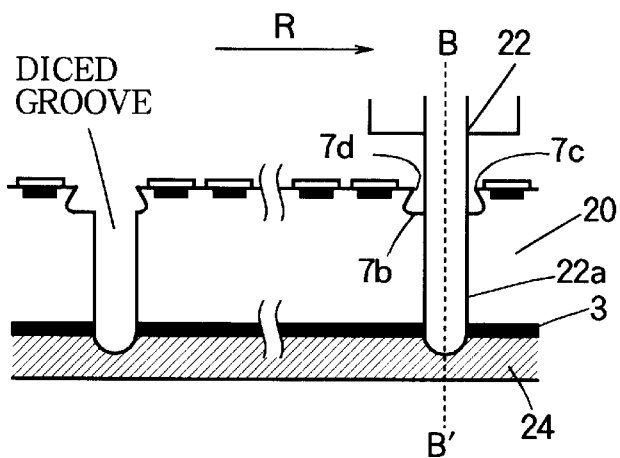
FIGS. 3A and 3B are cross-sectional views, illustrating the dicing process of the LED array according to the first embodiment.
Figure 3B:
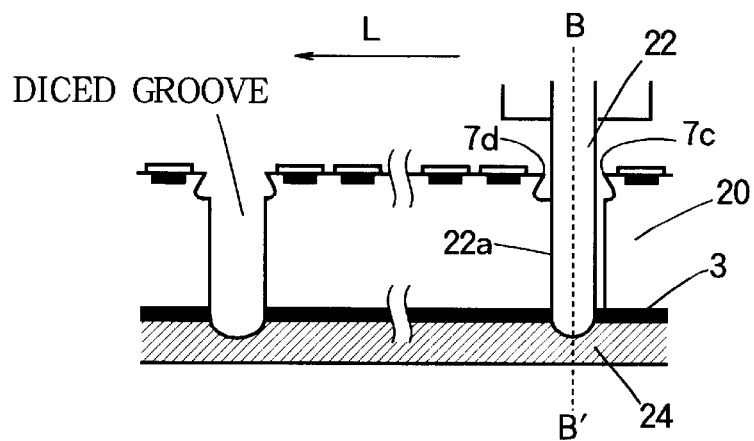

FIGS. 3A and 3B are cross-sectional views, illustrating the dicing process of the LED array according to the first embodiment.

Referring to FIGS. 2A and 2B, the dicing apparatus incorporates a wafer-carrying stage 21, a dicing blade 22, and a CCD camera 23 with a magnifying lens 23a. The stage 21 is, for example, a flat stainless plate having a highly flat surface. The semiconductor wafer 20 on which a plurality of LED arrays are formed is attached to a dicing tape 24 such that the common electrode 3 directly faces the dicing tape 24. The semiconductor wafer 20 is then fixed on the surface of the stage 21 using a fixing jig 25, so that the stage surface directly faces the dicing tape 24. The dicing blade 22 is a disc-shaped rotary type blade which contains minute diamond particles therein. The dicing blade 22 is held over the stage 21 so that the dicing blade 22 lies and rotates in a vertical plane and scribes the semiconductor wafer 20 from the front surface of the semiconductor wafer 20 to the back side. The CCD camera 23 shoots the front surface of the semiconductor wafer 20 in order to properly position the dicing blade 22. The dicing blade 22 and CCD camera 23 move in unison in directions shown by arrows X and Y. When the semiconductor wafer 20 is actually diced, only the dicing blade 22 alone lowers in a direction shown by arrow Z.

An offset Lf1 (FIG. 2A) or distance between the cutting plane B–B' of the diamond blade (i.e., cutting position of the semiconductor wafer 20) 22 and an optical axis A–A' of the CCD camera 23 is measured. The offset Lf1=Ld1±ΔLf1, where Ld1 is a designed value and A Lf1 is an error or deviation from the designed value. The diamond blade 22 and CCD camera 23 are first moved in unison to a position where the optical axis A–A' of the CCD camera 23 aims at the separation groove 7 extending in the Y-direction formed on the semiconductor wafer 20. With the diamond blade 22 and CCD camera 23 at this position, an area on the semiconductor wafer 20 in which the LED arrays are not formed is cut as a test reference position using the diamond blade 22. Then, the CCD camera 23 and the diamond blade 22 are moved distance Ld1 in the X-direction. The deviation Δ Lf1 of the optical axis of the CCD camera 23 from the test reference position is measured using the CCD camera 23.

The rotational position of semiconductor wafer 20 is adjusted by horizontally rotating the stage 21 until the directions of the separation grooves 7 are parallel with the directions of movement of the diamond blade 22 and CCD camera in the X-direction and Y-direction. In other words, the CCD camera 23 is moved in the X-direction to a position where the optical axis of the CCD camera 23 aims at a separation groove 7 that extends in a direction slightly off the X-direction. Then, the CCD camera 23 is then moved a predetermined distance in the X-direction. The deviation of groove 7 from the optical axis of the CCD camera 23 in the Y direction is measured. The stage 21 is horizontally rotated until this deviation does not exist.

Then, the semiconductor wafer 20 is vertically (in the Z-direction) diced from the front surface of the semiconductor wafer 20 to separate adjacent LED arrays (FIGS. 3A–3B) from each other. Referring to FIG. 3A, the CCD camera 23 and diamond blade 22 are first moved rightward (arrow R) in unison until the optical axis A–A' of the CCD camera 23 aims at a first cutting position where the optical axis is closer to the top edge 7c than to the top edge 7d. The CCD camera 23 and diamond blade 22 are then further moved in unison by the designed distance Lf1 from the first cutting position in the X-direction, so that the diamond blade 22 is now at the first position (FIG. 3A). The rotating diamond blade 22 is lowered in the Z-direction from the bottom surface 7b of the separation groove 7 into the semiconductor wafer 20 until the edge of the diamond blade 22 cuts through the common electrode 32. The diamond blade 22 is then moved in the Y-direction, along the top edge 7c of the separation groove 7 (FIG. 3A) from where the edge of the diamond blade 22 has cut through the common electrode 3. Then, the stage 21 is horizontally rotated through 180 degrees so that the diamond blade 22 is at a second cutting position (FIG. 3) where the diamond blade 22 is closer to the top edge 7d of the same separation groove 7 than to the top edge 7c. The rotating diamond blade 22 is again lowered in the Z-direction from the bottom surface 7b of the separation groove 7 into the semiconductor wafer 20 until the edge of the diamond blade 22 cuts through the common electrode 3. The diamond blade 22 is then moved in the Y-direction, along the top edge 7d of the separation groove 7 (FIG. 3B) from where the edge of the diamond blade 22 has cut through the common electrode 3.

Further, the stage 21 is horizontally rotated through 90 degrees and a dicing operation is carried out to cut the semiconductor wafer 20 along a separation groove 7 perpendicular to the groove 7 that has been diced. In the same manner as mentioned above, the diamond blade 22 is moved along the top edge 7c to cut the semiconductor wafer 20 and subsequently along the top edge 7d. Finally, the diced LED array chips are stripped from the dicing tape 24.

Figure 4:
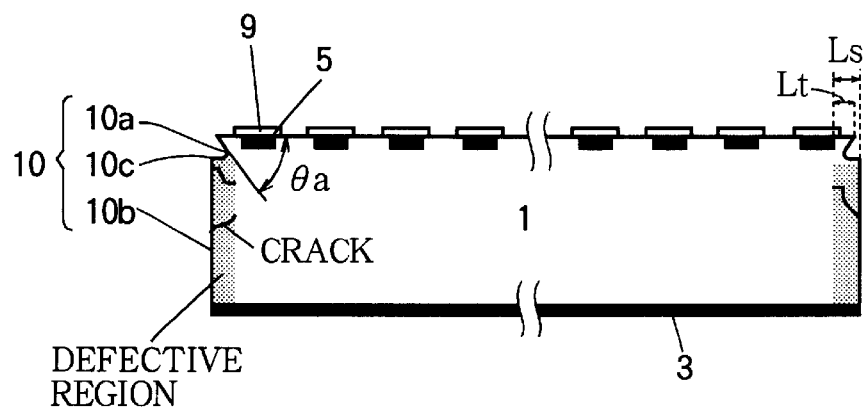
FIG. 4 is a cross-sectional view of the LED array chip after dicing.

FIG. 4 is a cross-sectional view of the LED array chip after it has been diced. The side surface 10 includes the etched surface 10a that makes an acute angle with the front surface of the chip, and the diced surface 10b that extends from the etched surface 10a to the back surface of the LED array chip. The diced surface 10b is substantially at a right angle with the back surface of the LED array chip on which the common electrode 3 is formed. Thus, the LED array chip has a substantially rectangular cross section.

Figure 28A:
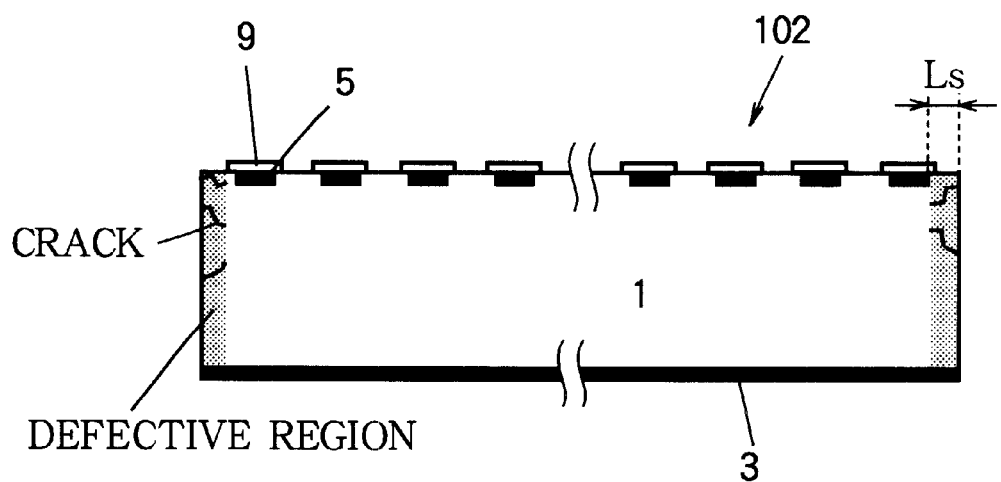
FIG. 28A illustrates a rectangular cross-sectional view of another conventional LED array chip.
Figure 28B:
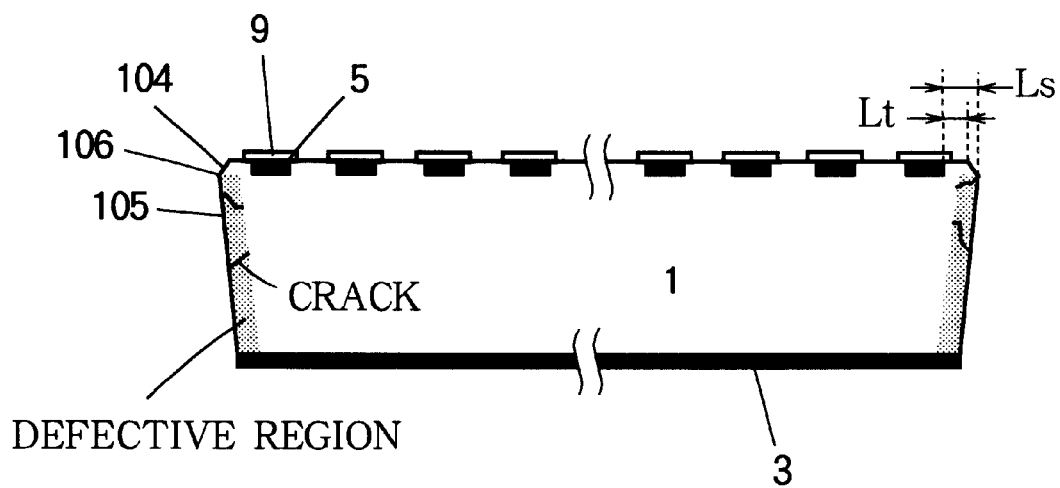
FIG. 28B shows an LED array chip of an inverted trapezoid.

An etched surface is free from chipping or cracking as opposed to a diced surface. With the chip shown in FIG. 4, the diced surface 10b does not extend beyond the etched surface 10a. This indicates that there is no defective region (e.g., chipping and cracking) near the light emitting element 5. Thus, the characteristics of the light emitting element 5 do not deteriorate as opposed to the conventional LED array chips (FIG. 28A) where chipping and crack are apt to occur near the light emitting element 5.

According to the first embodiment, the side walls of the separation groove 7 are formed by etching such that the side walls make acute angles θa with the front surface of the n-type substrate 1. Thus, the front surface of the n-type substrate 1 and surface regions just below the front surface are of a reverse mesa shape. Therefore, the wall of the separation groove 7 may be formed to extend further away from the front surface than the diffusion depth of the light emitting elements, while still maintaining the desired characteristics of the endmost light emitting element 5 even if the width or distance Lt between the endmost light emitting element 5 and the etched surface 10a is substantially short. This prevents deterioration of the characteristics of the light emitting elements 5. There is no need for providing a large width Ls between the end most light emitting element 5 and the outermost dimension of the chip surface, as opposed to the conventional LED array chips. This construction of the chip lends itself to high density arrangement of the light emitting elements.

Second Embodiment

Figure 5A:
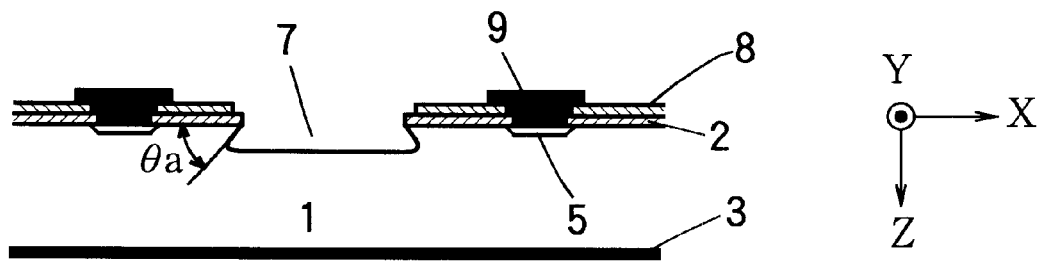
FIG. 5A is a cross-sectional view of the LED array formed on a semiconductor wafer according to a second embodiment.
Figure 5B:
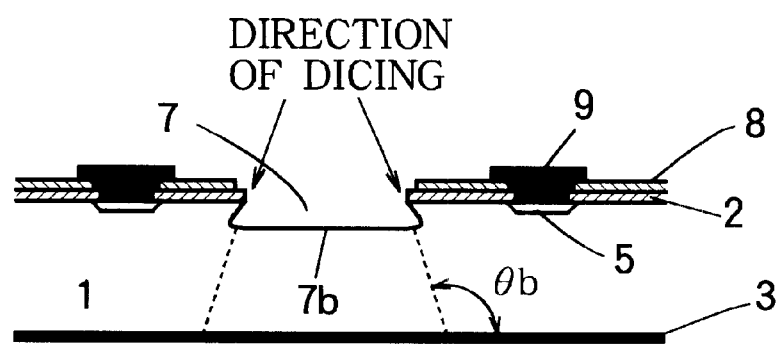
FIGS. 5B and 5C illustrate the dicing process through which the LED arrays according to the second embodiment are cut into individual chips.
Figure 5C:
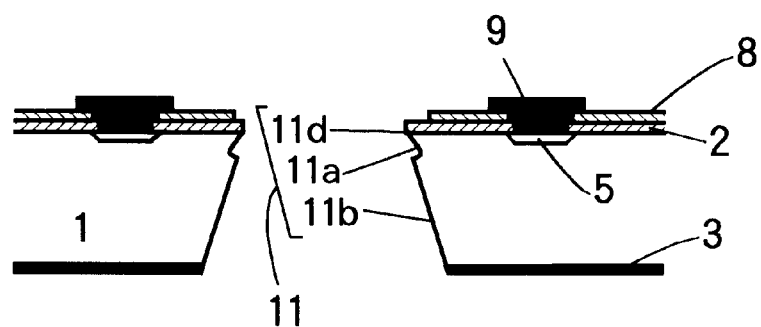

FIGS. 5A–5C are cross-sectional views, illustrating the manufacturing steps of an LED array according to a second embodiment.

FIG. 5A is a cross-sectional view of the LED array formed on a semiconductor wafer.

FIGS. 5B and 5C illustrate the dicing process through which the LED arrays fabricated on the semiconductor wafer are cut into individual chips.

Elements shown in FIGS. 5A–5C similar to those shown in FIG. 1 have been given the same reference numerals. The process in which the LED arrays are formed on the semiconductor wafer is the same as the first embodiment.

Referring to FIG. 5A, the separation grooves 7 are formed in the front surface of the n-type substrate 1 just as in the first embodiment. The separation groove 7 has inclined side walls that are at acute angles θa with the front surface of the n-type substrate 1. A p-type diffusion region (light emitting element) 5 is formed in an area in which an LED is to be formed.

As shown in FIGS. 5B and 5C, the n-type substrate 1 is diced from the bottom surface 7b of the separation groove 7 to the back surface of the n-type substrate 1 on which the common electrode 3 is formed. In other words, the n-type substrate 1 is diced in directions oblique to the back surface of the n-type substrate 1, so that the diced surface 11b makes an obtuse angle θb with the back surface of the n-type substrate 1 (FIG. 2B). The diamond blade 22 is then moved in the Y-direction, along the top edge 7c of the separation groove 7 from where the edge of the diamond blade 22 has cut through the common electrode 3. In this manner, the LED arrays formed on the n-type substrate 1 are cut into individual chips. The diced LED array chip has a side surface 11 including an etched surface 11a and a diced surface 11b. The etched surface 11a makes an acute angle θa with the front surface of the chip. The diced surface 11b makes an obtuse angle θb with the back surface of the chip. The etched surface 11a and the surface of the chip come together at the edge 11c to define the outermost dimension of the chip.

The dicing process of the LED array according to the second embodiment will now be described in detail.

Figure 6A:
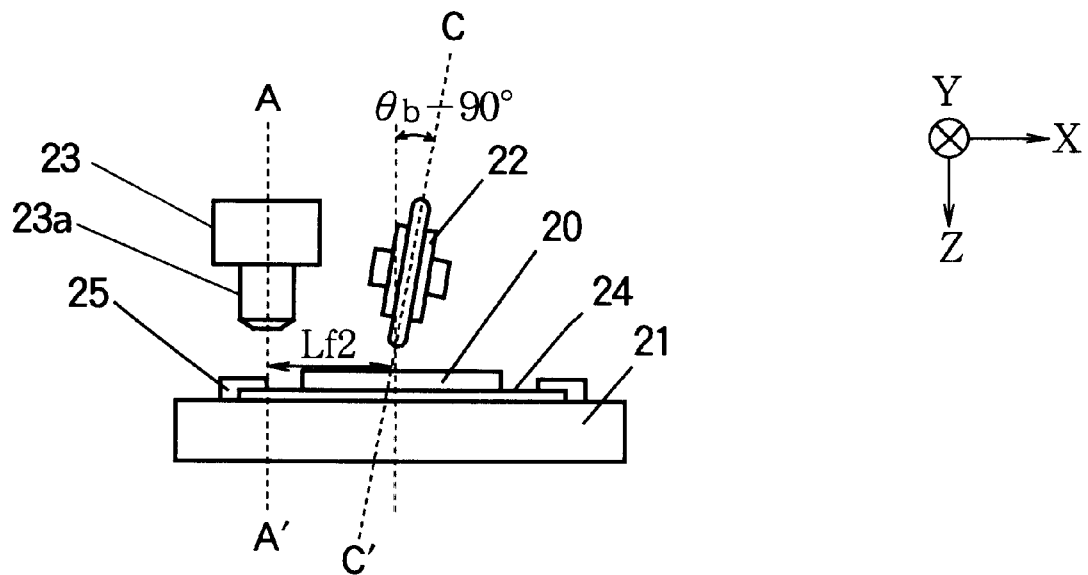
FIGS. 6A and 6B illustrate a general construction of a dicing apparatus used when the LED array is diced, FIG. 6A being a front view and FIG. 6B being a side view.
Figure 6B:
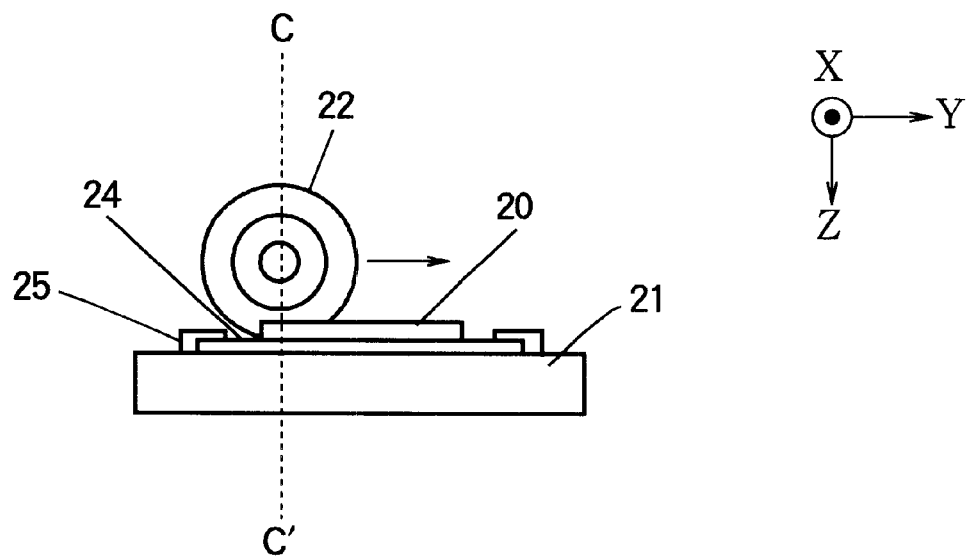

FIGS. 6A and 6B illustrate a general construction of a dicing apparatus used when the LED array is diced, FIG. 6A being a front view and FIG. 6B being a side view.

Elements of FIGS. 6A and 6B similar to those shown in FIGS. 2A and 2B have been given the same reference numerals.

Figure 7A:
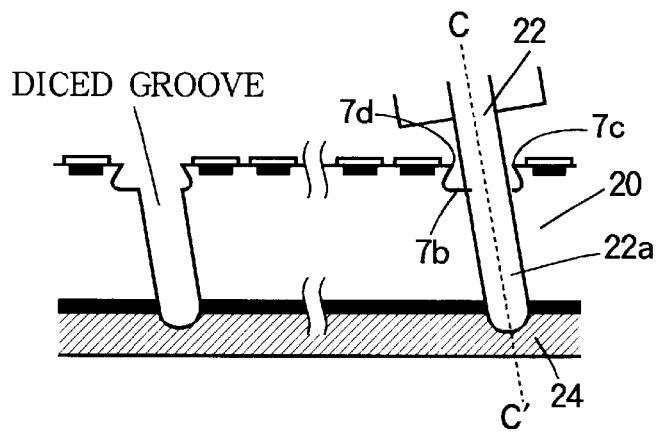
FIGS. 7A and 7B are cross-sectional views, illustrating the dicing process according to the second embodiment.
Figure 7B:
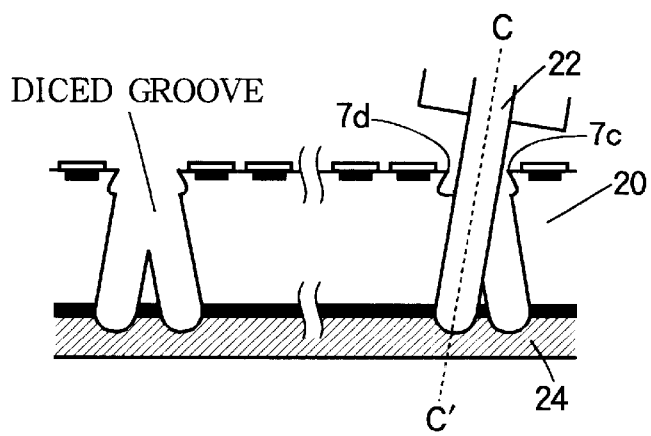

FIGS. 7A and 7B are cross-sectional views, illustrating the dicing process according to the second embodiment.

The dicing apparatus of FIGS. 6A and 6B differ from that of FIGS. 2A and 2B in that the dicing blade 22 is oriented obliquely relative to the optical axis of the CCD camera 23. In other words, the cutting plane of the dicing blade makes an angle θb −90 degrees (refer to FIG. 5B for θb) with a plane (Y-Z plane) defined by the Y-direction and the Z-direction.

Just as in the first embodiment, the semiconductor wafer 20 is fixedly placed on the stage 21 (FIGS. 6A and 6B).

Then, an offset Lf2 (FIG. 6A), i.e., the distance on the surface of the semiconductor wafer 20 between the cutting edge of the diamond blade 22 and the optical axis of the CCD camera 23 is measured. The offset Lf2=Ld2±ΔLf2, where Ld2 is a designed value and ΔLf2 is an error or deviation from the designed value Ld2. The diamond blade 22 and CCD camera 23 are moved to a position where the optical axis of the CCD camera 23 aims at the separation groove 7 that is formed on the semiconductor wafer 20 and extends in the Y direction. With the diamond blade 22 and CCD camera 23 at this position, an area of the semiconductor wafer 20 in which the LED arrays are not formed is cut as a test reference position using the diamond blade 22. Then, the CCD camera 23 is moved by the designed value Ld2 in the X direction toward the test reference position. The deviation ΔLf2 of the optical axis of the CCD camera 23 from the reference position is measured using the CCD camera 23.

Then, the semiconductor wafer 20 is horizontally rotated until the X- and Y-directions in which the diamond blade 22 and CCD camera move coincide with the directions in which the separation grooves 7 formed on the semiconductor wafer 20 extend.

Then, the CCD camera 23 and diamond blade 22 are first moved rightward in unison until the optical axis of the CCD camera 23 aims at a first cutting position where the optical axis A–A' is closer to the top edge 7c than to the top edge 7d. The CCD camera 23 and diamond blade 22 are then further moved in unison by the designed distance Lf2 from the first cutting position in the X-direction, so that the diamond blade 22 is now at the first position.

The rotating diamond blade 22 is lowered from the bottom surface 7b of the separation groove 7 into the semiconductor wafer 20 until the diamond blade 22 cuts beyond the common electrode 3. Also, the diamond blade 22 is moved in the Y-direction, along the top edge 7c of the separation groove 7 (FIG. 7A) from where the edge of the diamond blade 22 has cut through the common electrode 3.

Then, the stage 21 is horizontally rotated through 180 degrees so that the diamond blade 22 is at a second cutting position where the diamond blade 22 is now closer to the top edge 7d than to the to edge 7c. The rotating diamond blade 22 is lowered from the bottom surface 7b of the separation groove 7 until the diamond blade 22 passes through the common electrode 3 (FIG. 7B). Also, the diamond blade 22 is moved in the Y-direction, along the top edge 7d of the separation groove 7 (FIG. 7B) from where the edge of the diamond blade 22 has cut through the common electrode 3.

Further, the stage 21 is rotated in the horizontal plane through 90 degrees and the dicing is carried out to cut the semiconductor wafer 20 along a separation groove 7 perpendicular to the groove 7 that has been diced. Finally, the diced LED array chips are stripped from the dicing tape 24.

Figure 8:
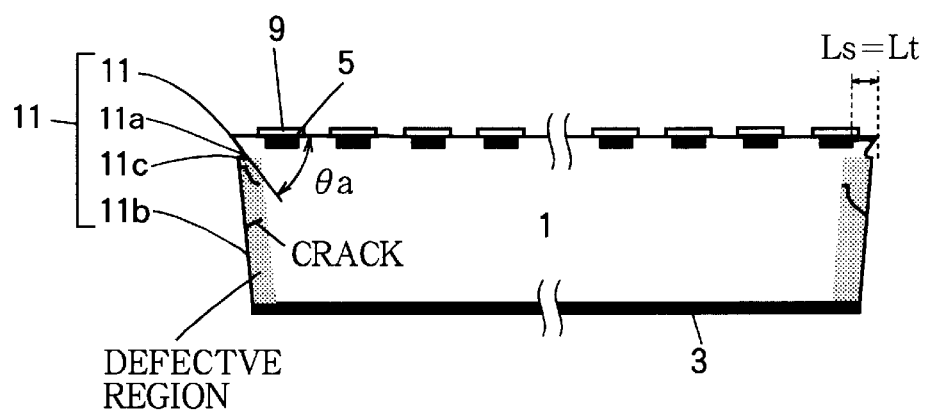
FIG. 8 is a cross-sectional view of a diced LED array chip according to the second embodiment.

FIG. 8 is a cross-sectional view of a diced LED array chip according to the second embodiment. As shown in FIG. 8, the side surface of the chip includes the etched surface 11a and the diced surface 11b. The etched surface 11a makes an acute angle $\theta a$ with the front surface of the chip. The diced surface 11b extends from the etched surface 11a to the back surface of the chip. The diced surface 11b makes an obtuse angle with the back surface of the chip on which the common electrode 3 is formed. Thus, the cross section of the chip is of generally an inverted trapezoid with a reverse mesa shape at an upper end portion.

The LED array chip according to the second embodiment is diced using a diamond blade 22 at an angle with the chip surface (FIG. 6). The front surface of the chip and the etched surface 11a come together at an edge 11d to define the outermost dimension of the chip. The distance Ls between the edge 11d and the endmost light emitting element 5 is not subjected to dicing error.

Just as in the first embodiment, the LED array according to the second embodiment has the etched surface 11a near the light emitting element 5. There is no chance of chipping or cracks occurring in an etched surface. In other words, the light emitting element 5 is sufficiently away from the diced surface 11b in which chipping and cracks are apt to occur due to a mechanical cutting operation. The construction of the second embodiment prevents the characteristics of the light emitting element 5 from varying.

Figure 9A:
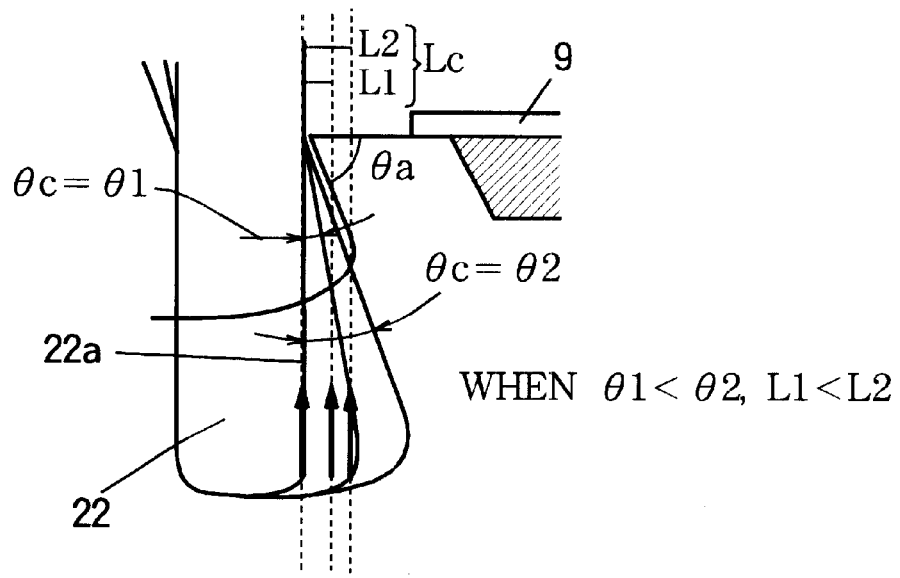
FIGS. 9A and 9B illustrate the dicing margin of the LED array according to the second embodiment, FIG. 9A illustrating the dicing margin with respect to the inclination of the diamond blade 22 and FIG. 9B illustrating the dicing margin with respect to the depth of the separation groove.
Figure 9B:
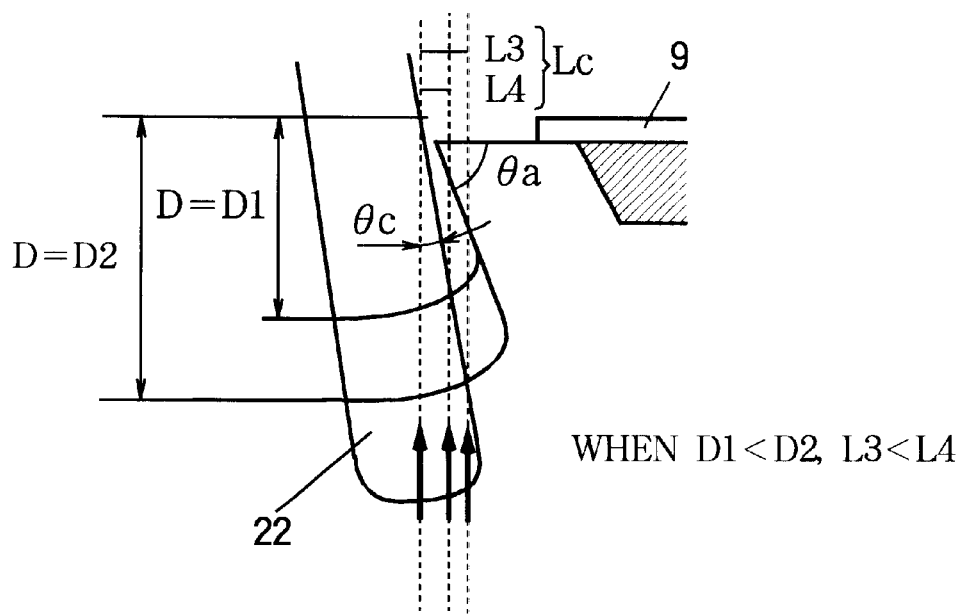

FIGS. 9A–9B illustrate a dicing margin of the LED array according to the second embodiment. FIG. 9A illustrates the dicing margin with respect to the inclination of the diamond blade 22 and FIG. 9B illustrates the dicing margin with respect to the depth of the separation groove 7.

Referring to FIG. 9A, the diamond blade 22 rotates in a plane at an angle $\theta c=\theta 1$ with a vertical plane, and enters the semiconductor wafer 20 near the end of the front surface of the LED array. Then, the diamond blade 22 reaches the back surface of the semiconductor wafer 20 at a point further into the chip than the top edge of the separation groove 7 so that the diced chip is generally of an inverted trapezoid. If the diamond blade 22 enters the semiconductor wafer 20 at an angle $\theta c=\theta 2$ (>$\theta 1$), then the diamond blade 22 reaches the back surface of the semiconductor wafer 20 at a point further into the chip than the top edge of the separation groove 7 by a distance L2 (>L1). Thus, as the angleoc increases, the diamond blade 22 enters deeper into the chip than the top edge of the separation groove 7. This implies that when the diamond blade 22 enters the semiconductor substrate at a point away from the top edge of the separation groove, the larger the angle $\theta c$ is, the further the diamond blade 22 can cut into the chip than the top of the separation groove 7.

Due to the dicing errors, the position of the diamond blade 22 with respect to the top of the separation groove 7 varies. If the diamond blade 22 enters the semiconductor wafer 20 at a distance L1 (or L2) from the top edge of the separation groove 7 at the angle $\theta c=\theta 1$ (or $\theta 2$), then the diamond blade 22 can dice the semiconductor wafer 20 without touching the top edge. The above distances L1 and L2 are referred to as dicing margin Lc which is a tolerance of positional error of the diamond blade 22 relative to the top edge of the separation groove 7. The diamond blade 22 has mechanical errors in dicing the semiconductor wafer 20 both in the horizontal direction and in the vertical direction.

Greater the angle $\theta c$ of the diamond blade 22 is, the larger the dicing margin Lc is. However, in order that the diamond blade 22 does not tough the wall of the separation groove 7, it is necessary that $\theta c \leq 90 - \theta a$. Thus, if the diamond blade 22 can be set such that $\theta c=90-\theta a$, then the dicing margin Lc is maximum. The plane in which the diamond blade 22 rotates makes an angle $\theta b$ with the back surface of the semiconductor wafer (back surface of the chip) 20. In other words, the diced surface 11b makes the angle $\theta b$. Since $\theta c=\theta b-90$, when $\theta c \leq 90-\theta a$, $\theta b \leq 180-\theta a$. Thus, when $\theta b \approx 180-\theta a$, the dicing margin Lc is maximum.

Referring to FIG. 9B, when the depth D of the separation groove 7 is D=D1, then the dicing margin Lc is Lc=L3. Also, when D=D2 (>D1), the dicing margin Lc=L4 (>L3). The greater the depth D of the separation groove 7, the larger the dicing margin Lc.

If the dicing error ±H (i.e., error in a horizontal direction with respect to the semiconductor wafer 20) can be controlled such that Lc≧2×H, then the diamond blade 22 (surface 22a of the blade 22) can enter the semiconductor wafer 20 aiming at a position Lc/2 from the top edge of the separation groove 7. Thus, the LED array can be diced at a portion further into the n-type substrate 1 than the top edge of the separation groove 7 without the surface 22a of the diamond blade 22 touching the top edge of the separation groove 7 even if the dicing error is encountered. Thus, the variations in the distance Ls between the endmost light emitting element and the outermost dimension of the chip can be reduced.

Since the dicing margin Lc is given by Lc=D×tan $\theta c$=D×tan($\theta b$-90), in order for the dicing margin Lc to become Lc=2×H, the depth D of the separation groove 7 can be D≧2×H/tan $\theta c$=2×H×cot($\theta b$-90).

Third Embodiment

Figure 10A:
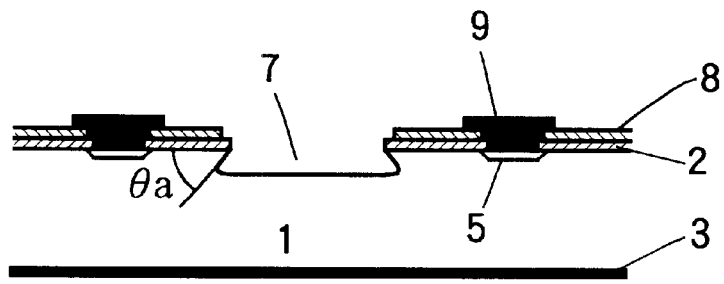
FIG. 10A is a cross-sectional view of an LED array formed on a semiconductor wafer according to a third embodiment.
Figure 10B:
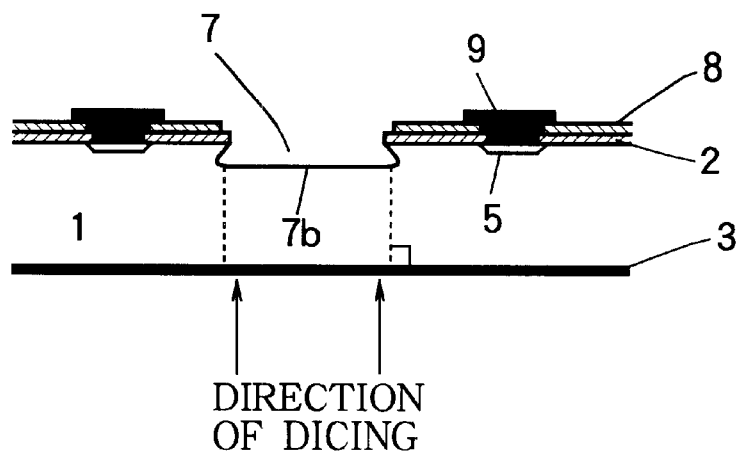
FIGS. 10B and 10C are cross-sectional views, illustrating the dicing steps in which the LED arrays of the third embodiment are diced into individual chips.
Figure 10C:
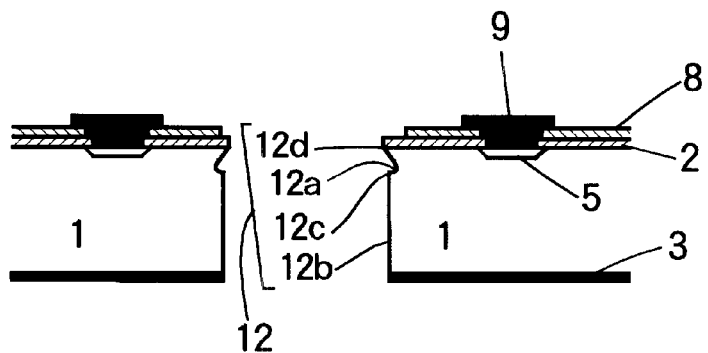

FIGS. 10A–10C are cross-sectional views, illustrating the manufacturing steps of an LED array according to a third embodiment.

FIG. 10A is a cross-sectional view of an LED array formed on a semiconductor wafer and corresponds to FIG. 1D.

FIGS. 10B and 10C are cross-sectional views, illustrating the dicing steps in which the LED arrays formed on the semiconductor wafer are diced into individual chips.

Elements shown in FIGS. 10A–10C similar to those of FIG. 1 have been given the same reference numerals. The process for forming LED arrays of the third embodiment is the same as in the first embodiment.

As shown in FIG. 10A, just as in the first embodiment (FIGS. 1A–1D), each of the separation grooves 7 is formed in the front surface of an n-type substrate 1, the separation groove 7 being formed in area through which the adjacent LED arrays are cut into individual chips. The separation groove 7 has side walls that make acute angles θa with the front surface of the n-type substrate 1. A p-type diffusion regions (light emitting elements) 5 is formed in the LED array region.

As shown in FIGS. 10B and 10C, the n-type substrate 1 is diced from the back surface of the n-type substrate 1 to the bottom surface 7b of the separation groove 7. The n-type substrate 1 is diced also in a horizontal direction along the separation grooves 7, thereby cutting the LED arrays formed on the n-type substrate 1 into individual chips. A side surface of each of the diced LED array chips includes the etched surface 12a and the diced surface 12b. The etched surface makes an acute angle with the front surface of the chip. The diced surface 12b is substantially at right angles with the back surface of the chip. When the chip is seen from the front surface side, the outermost dimension of the chip is defined by the edge 12d at which the front surface of the chip and the etched surface 12a come together.

The dicing process of the LED arrays according to the third embodiment will now be described with reference to FIGS. 11A and 11B.

Figure 11A:
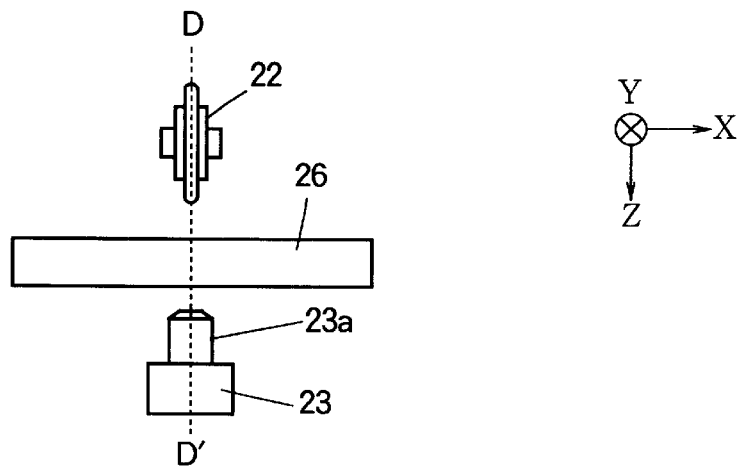
FIGS. 11A and 11B are a front view of a dicing apparatus used for dicing the LED arrays in the third embodiment.
Figure 11B:
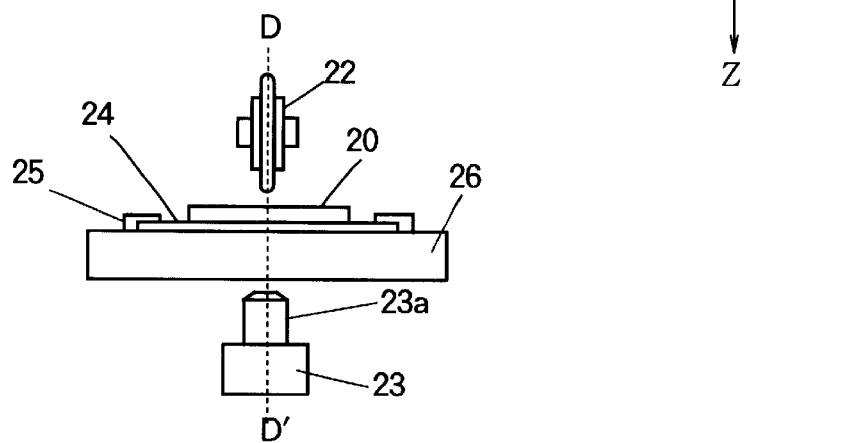

FIG. 11A is a front view of a dicing apparatus used for dicing the LED arrays and FIG. 11B is a side view.

FIG. 12 is a cross-sectional view illustrating the dicing process.

Elements of FIGS. 11A and 11B similar to those of FIG. 2 have been given the same reference numerals. Elements of FIG. 12 similar to those of FIG. 3 have been given the same reference numerals.

Figure 11C:
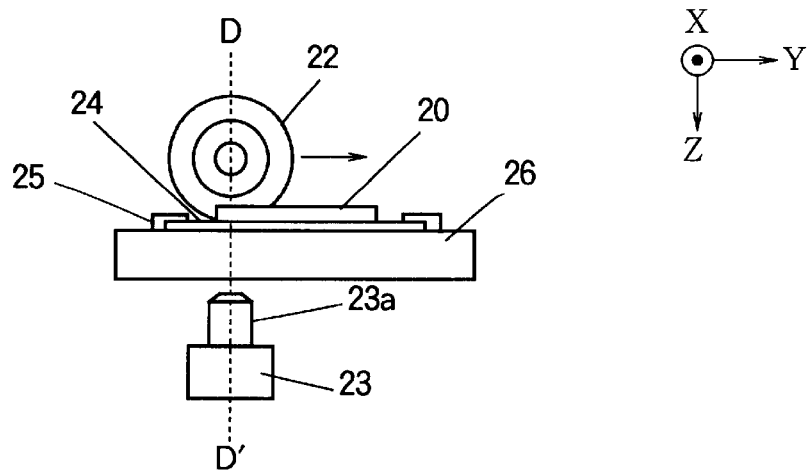
FIG. 11C is a side view of a dicing apparatus used for dicing the LED arrays in the third embodiment.

The dicing apparatus of FIG. 11 differs from that of FIG. 2 in that a transparent stage 26 is used in place of the stage 21 and the CCD camera 23 having a magnifying lens 23a is disposed on the bottom surface side of the stage 26. The stage 26 is formed of a highly flat, transparent material such as quartz glass. The CCD camera 23 shoots the surface of the semiconductor wafer 20 through the transparent stage 26 to detect the position of the separation groove 7. The CCD camera 23 and dicing blade 22 move together both in the X-direction and in the Y-direction. The position of the CCD camera 23 relative to the dicing blade 22 can be adjusted within a predetermined range.

Prior to the placement of the semiconductor wafer 20 on the stage 26, the position of the CCD camera 23 is adjusted in fine increments so that the optical axis of the CCD camera 23 lies in the plane in which the diamond blade 22 lies (FIG. 11A).

The semiconductor wafer 20 having separation grooves 7 and a plurality of LED arrays formed thereon is attached to a transparent dicing tape 24 such that the grooves 7 and the plurality of LED arrays directly face the dicing tape 24. Then, the semiconductor wafer 20 attached to the dicing tape 24 is fixed on the stage 26 using the fixing jig 25. The semiconductor wafer 20 is placed on the stage 26 with the dicing tape 24 directly facing the stage 26 (FIG. 11B)

Then, a test dicing is performed in order to precisely determine the height of the diamond blade 22 at which the blade 22 should stop lowering when the semiconductor wafer 20 is actually diced. The rotating dicing blade 22 is first lowered in the Z-direction toward the CCD camera 23. The CCD camera monitors the height of the diamond blade 22 to detect the height of the diamond blade 22 when the tip of the diamond blade 22 has lowered just past the bottom of the separation groove 7 formed in the semiconductor wafer 20. Then, the diamond blade 22 is raised from the semiconductor wafer 20. This completes the adjustment of the height of the diamond blade 22.

Then, just as in the first embodiment, the stage 26 is rotated in a horizontal plane such that the grooves 7 extend parallel with the X-direction and Y-direction in which the CCD camera 23 and diamond blade 22 move together.

Then, the semiconductor wafer 20 is diced in the Z direction such that the diamond blade 22 reaches the bottom surface 7b of the separation groove 7, thereby dicing the LED arrays. The detailed dicing operation is performed as follows: First, just as in the first embodiment, the diamond blade 22 and CCD camera 23 are moved in the X-direction so that the diamond blade 22 is at the first cutting position where the diamond blade 22 is closer to the top edge 7c than to the top edge 7d. The rotating diamond blade 22 is lowered from the back surface semiconductor wafer 20 until the diamond blade 22 passes the bottom surface 7b of the separation groove 7. The rotating diamond blade 22 is then moved also in the Y-direction, along the top edge 7c of the separation groove 7 (FIG. 12A) from where the edge of the diamond blade 22 has passed the bottom surface 7b of the separation groove 7. Then, the diamond blade 22 is lifted from the semiconductor wafer 20. The stage 21 is then horizontally rotated through 180 degrees so that the diamond blade 22 at the second cutting position where the diamond blade 22 is closer to the top edge 7d of the same separation groove 7 than to the top edge 7c. The rotating diamond blade 22 is again lowered in the Z-direction from the back surface of the semiconductor wafer 20 until the diamond blade 22 passes the bottom surface 7b of the separation groove 7. The rotating diamond blade 22 is moved also in the Y-direction, along the top edge 7d of the separation groove 7 (FIG. 12B) from where the edge of the diamond blade 22 has passed the bottom surface 7b of the separation groove 7.

Then, the diamond blade 22 is lifted from the semiconductor wafer 20. Then, the stage 26 is rotated though 90 degrees in the horizontal plane and then the diamond blade 22 is again moved to cut the semiconductor wafer 20 along a separation groove 7 perpendicular to the separation groove 7 that has been diced. Just as described with reference to FIGS. 12A and 12B, the diamond blade 22 cuts the semiconductor wafer 20 along the separation groove 7 twice; along the top edge 7c, and then along the top edge 7d. Finally, the diced LED chips are removed from the dicing tape 24.

The side surface of the LED array chip according to the third embodiment includes the etched surface 12a and the diced surface 12b. The etched surface 12a is of a reverse mesa shape that makes an acute angle with the front surface of the chip. The diced surface 12b extends from the etched surface 12a to the back surface of the chip. The diced surface 12b makes substantially a right angle with the back surface of the chip on which the common electrode 3 is formed. Thus, the cross section of the chip is a rectangle in shape. The etched surface 12a and the front surface of the chip come together at the edge 12d that defines the outermost dimension of the chip.

The separation groove 7 is formed in the shape of a reverse mesa, so that the etched surface 12a extends into the semiconductor wafer 20 under the endmost light emitting element 5 while still being sufficiently separated from the bottom of the endmost light emitting element 5. The diamond blade 22 does not cut portions near edges 7c and 7d, i.e., near the endmost light emitting elements 5, but only reaches a position at which the bottom surface 7b of the separation groove 7 and the etched surface 12a come together, so that there is no possibility of chipping and cracking occurring in the proximity to the light emitting element 5.

Thus, the characteristics of the endmost light emitting element 5 do not deteriorate. A shorter and more accurate distance between the endmost light emitting element and the edge of the chip can be defined without chipping or cracking by etching than by conventional dicing.

Figure 13:
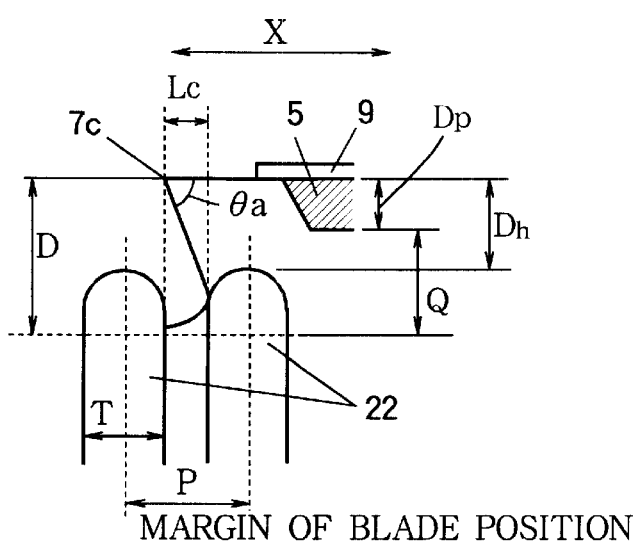
FIG. 13 illustrates the dicing margin of the LED array according to the third embodiment.

FIG. 13 illustrates the dicing margin of the LED array according to the third embodiment.

In the third embodiment, the semiconductor wafer 20 is diced from the back surface thereof toward the front surface and the diamond blade 22 does not reach the front surface of the semiconductor wafer 20. In other words, the diamond blade 22 should cut into the semiconductor wafer 20 such that Dp<Dn<D, where Dp is a depth of the light emitting element 5, Dn is a depth from the surface of the semiconductor wafer 20 and is a limit beyond which the diamond blade 22 does not cut, and D is a depth of the separation groove 7. Thus, the distance Q=D−Dp between the bottom surface 7b of the separation groove 7 and the bottom of the light emitting element 5 is the margin into which the diamond blade 22 can cut into the semiconductor wafer 20.

The distance Q should be set to satisfy $Q \geq 2H$, where H is the dicing error of the dicing apparatus. Therefore, $Q=D-Dp \geq 2H$ can be rewritten into $D \geq 2H+Dp$. Thus, the diamond blade 22 should cut into the semiconductor wafer 20 aiming at the target depth given by $Dn=H+Dp$, so that the diamond blade 22 reaches the etched surface 12a at a position before the bottom of the light emitting element 5 is reached.

The positional margin P of the diamond blade 22 is given by $P=T+Lc \approx T+D \cdot \cot \theta a$ where T is a thickness of the diamond blade 22, and Lc is a distance in the X-direction between the top of the separation groove 7 and the end of the bottom surface 7b of the separation groove 7.

Fourth Embodiment

Figure 14A:
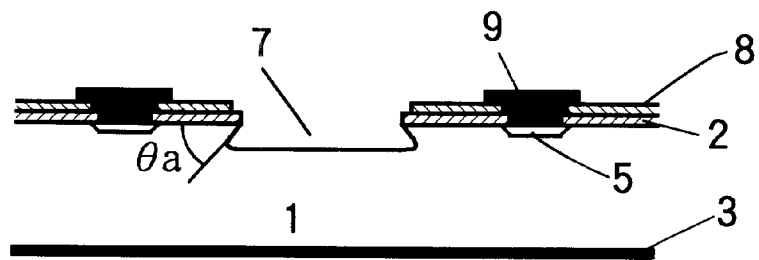
FIG. 14A is a cross sectional view of the LED array formed on a semiconductor wafer according to a fourth embodiment.
Figure 14B:
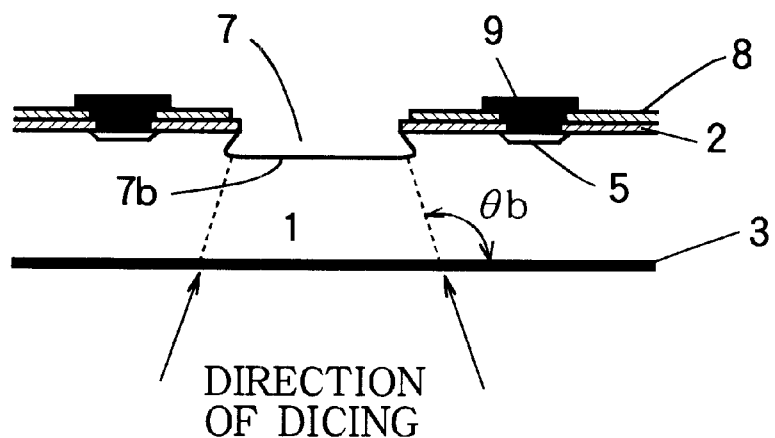
FIGS. 14B and 14C are cross-sectional views illustrating the dicing process in which the LED arrays formed on the semiconductor wafer are cut into individual chips.
Figure 14C:
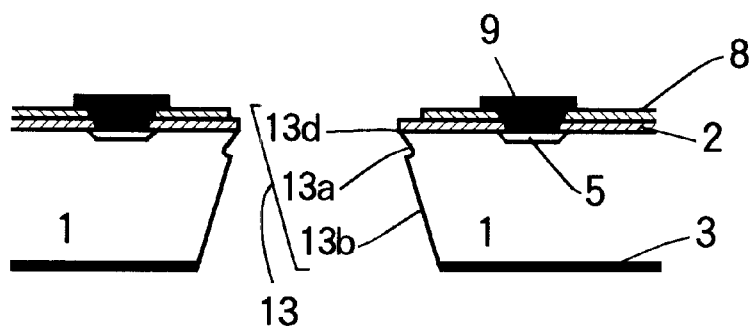

FIGS. 14A–14C are cross-sectional views, illustrating the manufacturing process of an LED array according to a fourth embodiment.

FIG. 14A is a cross sectional view of the LED array formed on a semiconductor wafer, and corresponds to FIG. 1D.

FIGS. 14B and 14C are cross-sectional views, illustrating the dicing process in which the LED arrays formed on the semiconductor wafer are cut into individual chips.

Elements of FIGS. 14A–14C similar to those of FIG. 1 have been given the same reference numerals. The LED arrays are formed on the semiconductor wafer in the same manner as the first embodiment.

As shown in FIG. 14A, just as in the first embodiment (FIGS. 1A–1D), the separation grooves 7 and the p-type diffusion regions are formed in the front surface of an n-type substrate 1. The separation grooves 7 are formed in areas through which the LED arrays are cut into individual chips. The p-type diffusion regions (light emitting elements) 5 are formed in the LED array regions. For simplicity, FIG. 14 shows only one separation groove 7 and one p-type diffusion region 5. The separation groove 7 has side walls that make acute angles θa with the front surface of the n-type substrate 1.

Referring to FIGS. 14B and 14C, a dicing is performed such that the n-type substrate 1 is diced at an angle of θb with the back surface of the n-type substrate 1 from the back surface of the n-type substrate 1 to the bottom surface 7b of the separation groove 7. The n-type substrate 1 is diced also in the horizontal direction along the separation grooves 7, thereby cutting the LED arrays into individual chips. A side surface 13 of the LED array chip includes the etched surface 13a and the diced surface 13b. The etched surface 13a is at an acute angle with the front surface of the chip. The diced surface 13b is at an obtuse angle with the back surface of the chip. The front surface of the chip and the etched surface 13a come together at the edge 13d, thereby defining the outermost dimension of the chip.

The dicing process of the LED arrays according to the fourth embodiment will now be described in detail with reference to FIGS. 15 and 16.

Figure 15:
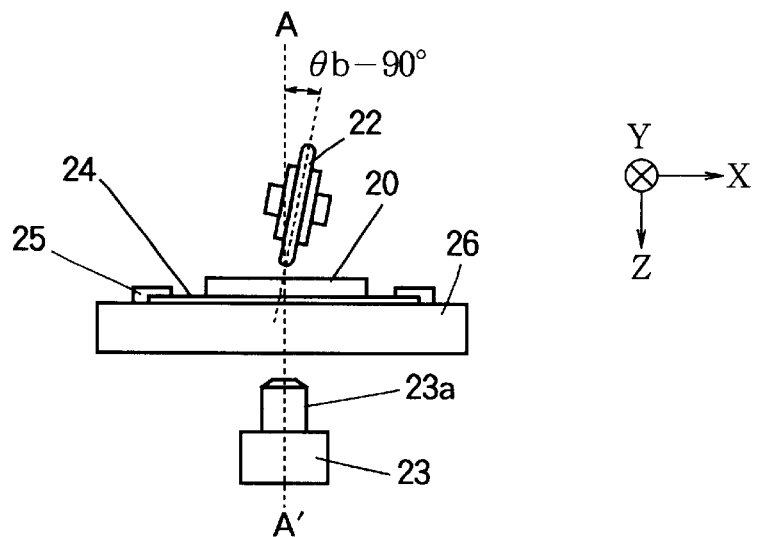
FIG. 15 is a front view of a dicing apparatus used for dicing the LED arrays.

FIG. 15 is a front view of a dicing apparatus used for dicing the LED arrays. Elements of FIG. 15 similar to those of FIG. 11 have been given the same reference numerals.

Figure 16A:
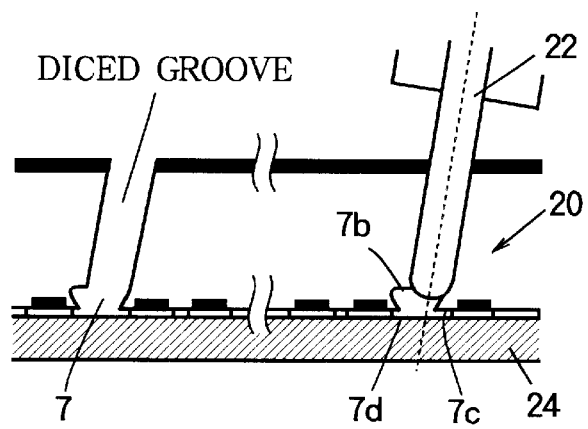
FIGS. 16A and 16B are side views illustrating the dicing process.
Figure 16B:
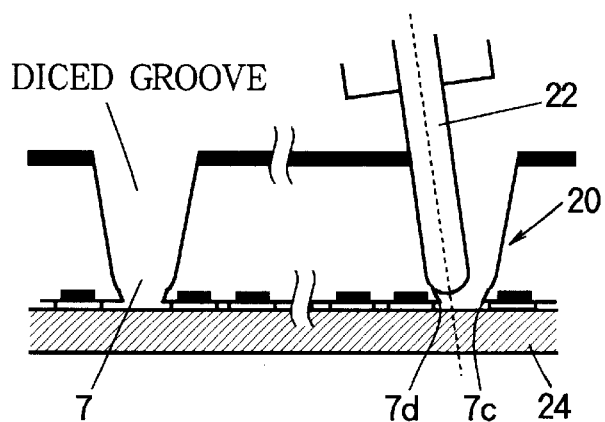

FIGS. 16A and 16B are side views, illustrating the dicing process. Elements of FIGS. 16A and 16B similar to those of FIG. 12 have been given the same reference numerals.

The dicing apparatus of FIG. 15 differs from that of FIG. 11 in that the dicing blade 22 lies in a plane at an angle of θb–90 with the Y-Z plane (see FIG. 14B for θb).

Before the semiconductor wafer 20 is placed on the dicing apparatus, the position of the CCD camera 23 is adjusted in fine increments in the X-direction such that the diamond blade 22 lies in a plane that intersects the optical axis A–A' of the CCD camera on the front surface of the semiconductor wafer 20 as shown in FIG. 15.

Just as in the third embodiment, the semiconductor wafer 20 is attached to the transparent dicing tape 24 with the front surface of the semiconductor 20 facing the dicing tape 24. Then, the semiconductor wafer 20 is fixedly mounted on the transparent stage 26 with the dicing tape 24 directly facing the transparent stage 26. Then, the maximum vertical stroke of the diamond blade 22 is adjusted such that when the semiconductor wafer 20 is diced, the diamond blade 22 lowers just past the bottom of the separation groove 7 formed in the semiconductor wafer 20. Also, the position of the stage 26 is rotated in fine increments in the horizontal plane such that the grooves 7 extend in directions parallel to the direction in which the diamond blade 22 is horizontally moved.

Figure 12A:
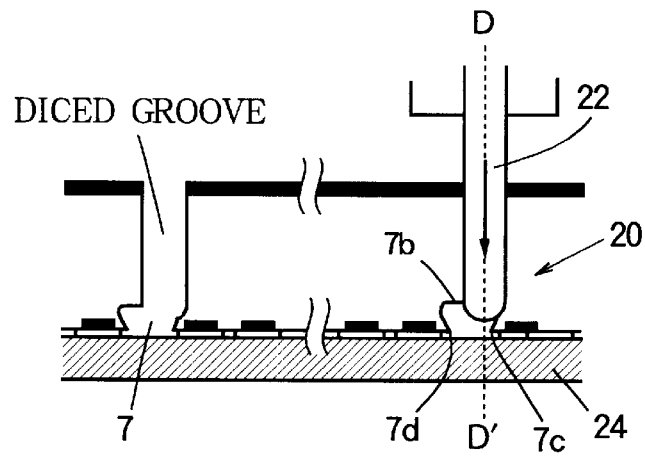
FIGS. 12A and 12B are a cross-sectional view illustrating the dicing process.
Figure 12B:
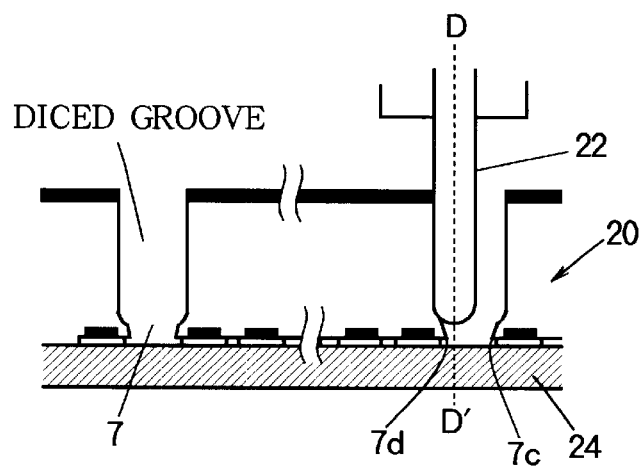

Then, the semiconductor wafer 20 is diced in the Z direction such that the diamond blade 22 reaches the bottom surface 7b of the separation groove 7, thereby dicing the LED arrays into individual chips (FIGS. 12A and 12B).

The detailed dicing operation is performed as follows:

First, just as in the first embodiment, the diamond blade 22 is moved, by using the CCD camera 23, to the first cutting position where the diamond blade 22 is closer to the top edge 7c than to the top edge 7d.

Then, the rotating diamond blade 22 is lowered in the direction at the angle θb with the back surface of the semiconductor wafer 20, so that the semiconductor wafer 20 is diced from the back surface semiconductor wafer 20 until the cutting edge of the diamond blade 22 passes the bottom surface 7b of the separation groove 7. The rotating diamond blade 22 is moved also in the Y-direction, along the top edge 7c of the separation groove 7 (FIG. 16A) from where the cutting edge of the diamond blade 22 has passed the bottom surface 7b. Then, the stage 26 is rotated through 180 degrees in the horizontal plane so that the diamond blade 22 is now at the second cutting position where the diamond blade 22 is closer to the top edge 7d of the same separation groove 7 than to the top edge 7c. The rotating diamond blade 22 is again lowered in the direction at the angle θb with the back surface of the semiconductor wafer 20, so that the semiconductor wafer 20 from the back surface semiconductor wafer 20 until the cutting edge of the diamond blade 22 passes the bottom surface 7b of the separation groove 7. The rotating diamond blade 22 is moved also in the Y-direction, along the top edge 7d of the separation groove 7 (FIG. 16B) from where the cutting edge of the diamond blade 22 has passed the bottom surface 7b.

Then, the stage 26 is rotated through 90 degrees in the horizontal plane, so that the diamond blade 22 now cuts the semiconductor wafer 20 along a separation groove 7 perpendicular to the separation groove 7 that has been diced. Again, the diamond blade 22 cuts the semiconductor wafer 20 along the separation groove 7 twice; along the top edge 7c, and then along the top edge 7d. Finally, the diced LED chips are removed from the dicing tape 24.

The side surface 13 of the LED array chips according to the fourth embodiment includes the etched surface 13a and the diced surface 13b. The etched surface 13a is at an acute angle with the front surface of the chip. The diced surface 13b is between the etched surface 13a and the back surface of the chip and makes an obtuse angle with the back surface of the chip. Thus, the chip is generally of an inverted trapezoid. The front surface of the chip and the etched surface 13a come together at an edge 13d, thereby defining the outermost dimension of the chip.

Figure 17:
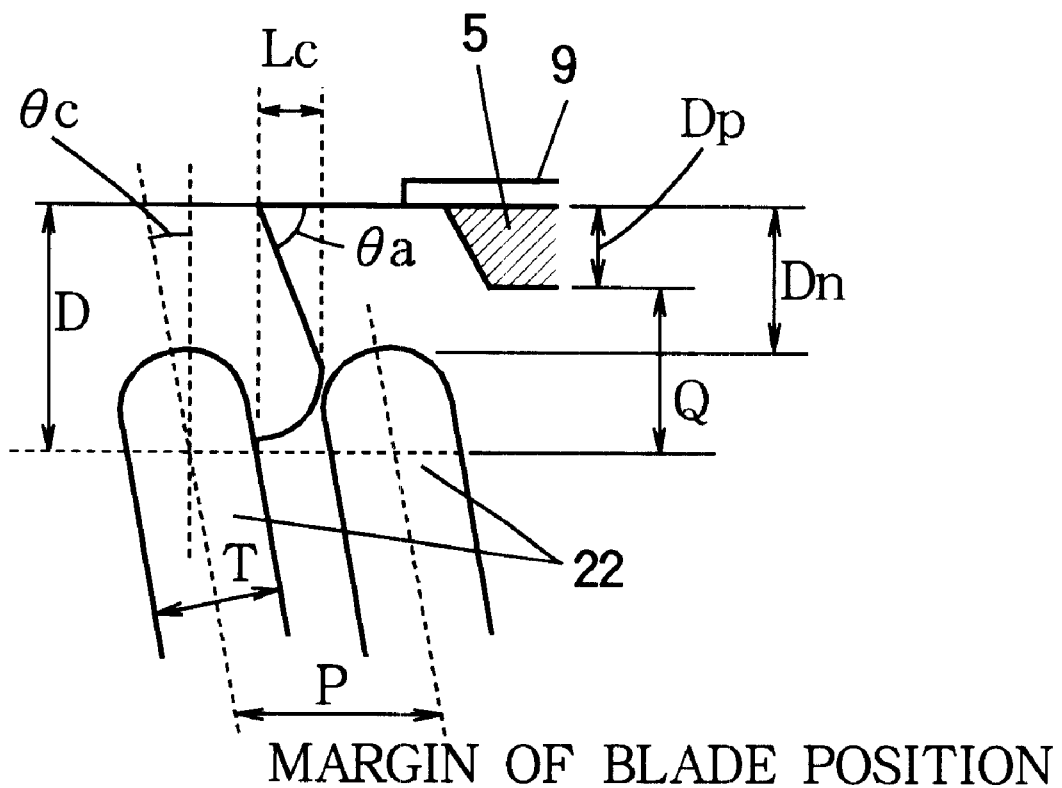
FIG. 17 illustrates the dicing margin of the LED array of the fourth embodiment.

FIG. 17 illustrates the dicing margin of the LED array of the fourth embodiment.

Jus as in the third embodiment, the distance Q should be set by $Q \geqq 2H$ where H is the dicing error of the dicing apparatus. Therefore, $Q=D-Dp \geqq 2H$ can be rewritten into $D \geqq 2H+Dp$. Thus, the diamond blade 22 should cut into the semiconductor wafer 20 such that Dn=H+Dp. Therefore, the diamond blade 22 reaches the etched surface at a position before the bottom of the light emitting element 5 is reached. The positional margin P of the diamond blade 22 in the horizontal direction is given by $$P=T/\cos \theta c + Lc \approx T/\cos \theta c + D \cdot \cot \theta a$$

where T is a thickness of the diamond blade 22, and Lc is a distance between the top of the separation groove 7 and the bottom edge of the separation groove 7 in the horizontal direction, and θc is an angle at which the diamond blade 22 is inclined.

Fifth Embodiment

FIGS. 18A–18D are cross-sectional views, illustrating the manufacturing process of an LED array according to a fifth embodiment.

Figure 18A:
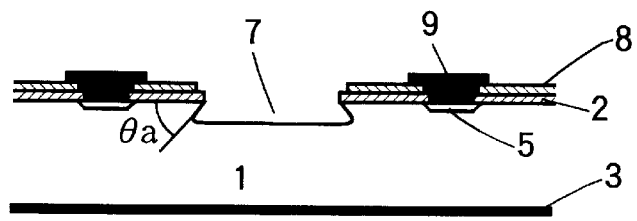
FIGS. 18A and 18B are cross-sectional views, illustrating an LED array according to a fifth embodiment.
Figure 18B:
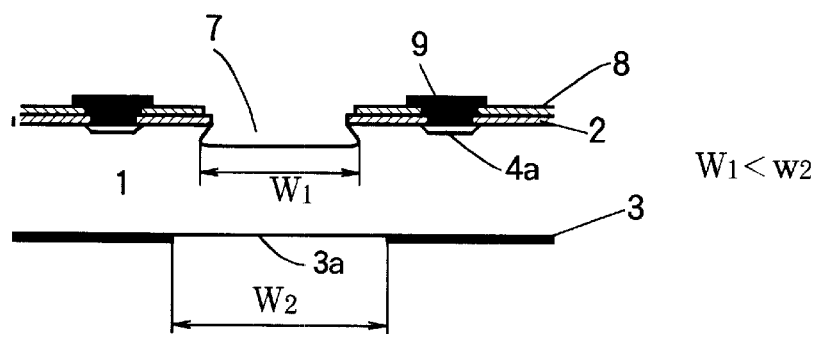

FIGS. 18A and 18B are cross-sectional views, illustrating an LED array formed on the semiconductor wafer. FIGS. 18A and 18B correspond to FIG. 1D.

Figure 18C:
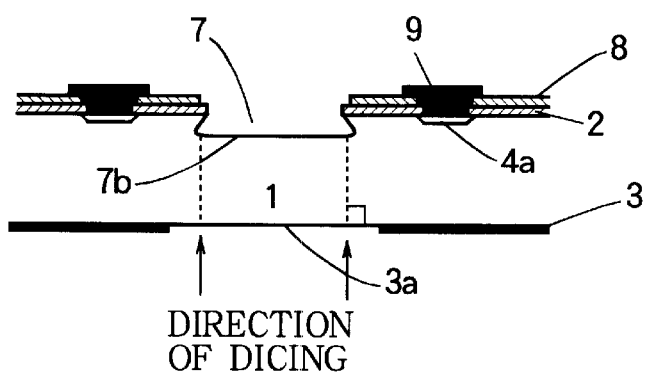
FIGS. 18C and 18D are cross-sectional views, illustrating the dicing process in which the LED arrays according to the fifth embodiment are cut into individual chips.
Figure 18D:
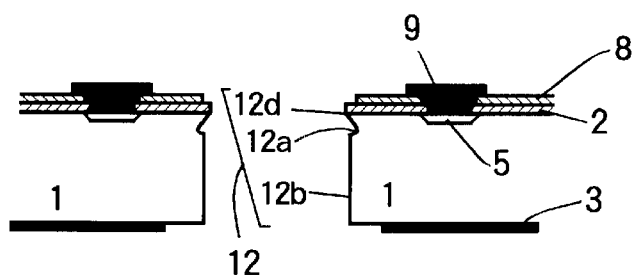

FIGS. 18C and 18D are cross-sectional views, illustrating the dicing process in which the LED arrays formed on the semiconductor wafer are cut into individual chips.

Elements of FIGS. 18A–18D similar to those of FIGS. 1 and 10 have been given the same reference numerals.

The LED arrays of the fifth embodiment are formed on the semiconductor wafer just as in the first embodiment (see FIGS. 1A–1D)

As shown in FIG. 18A, just as in the first embodiment (FIGS. 1A–1D) the separation grooves 7 and p-type diffusion regions 5 are formed in the front surface of the n-type substrate 1, the grooves 7 being formed in areas at which the LED arrays are cut into individual chips. For simplicity, FIGS. 18A–18D show only one separation groove 7 and endmost diffusion regions 5 of adjacent LED array. The separation groove 7 has side walls that make acute angles θa with the front surface of the n-type substrate 1.

As shown in FIG. 18B, an area of the n-side electrode (common electrode) 3 that opposes the separation groove 7 is removed by photolithography and etching, thereby forming an opening 3a through which the n-type substrate 1 is exposed. The opening 3a extends parallel to the separation groove 7and has a larger width than the separation groove 7 so that the perimeter of the separation groove 7 do not extend to the perimeter of the opening 3a (i.e., W1<W2).

As shown in FIGS. 18C and 18D, the n-type substrate 1 is diced vertically (in the Z-direction) from the opening 3a formed in the back surface of the n-type substrate 1 to the bottom surface 7b of the separation groove 7. The n-type substrate 1 is diced also in the horizontal direction along the separation groove 7 from where the diamond blade has cut through the bottom surface 7b, thereby cutting the LED arrays into individual chips. A side surface 12 of the LED array chip of the fifth embodiment is the same as that of the third embodiment. The side surface 12 includes the etched surface 12a and the diced surface 12b. The etched surface 12a is at an acute angle with the front surface of the chip. The diced surface 12b is substantially at a right angle with the back surface of the chip. The front surface of the chip and the etched surface 12a come together at the edge 12d, thereby defining the outermost dimension of the chip.

The dicing process of the LED arrays according to the fifth embodiment will now be described in detail with reference to FIGS. 19 and 20.

Figure 19:
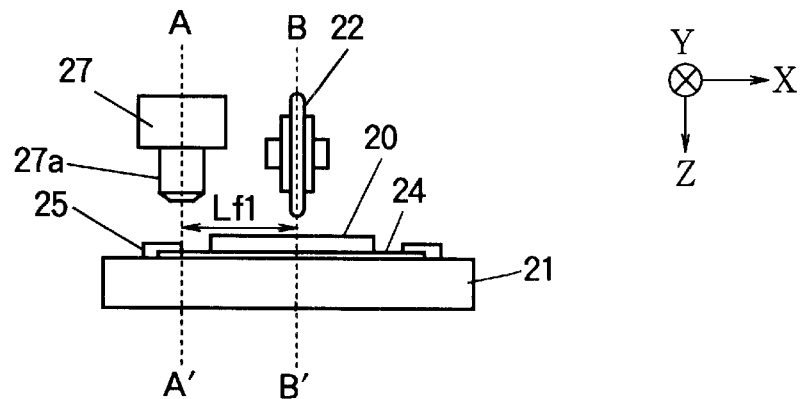
FIG. 19 is a front view of a dicing apparatus used for dicing the LED arrays of the fifth embodiment.

FIG. 19 is a front view of a dicing apparatus used for dicing the LED arrays.

Elements of FIG. 19 similar to those of FIG. 2 have been given the same reference numerals.

Figure 20A:
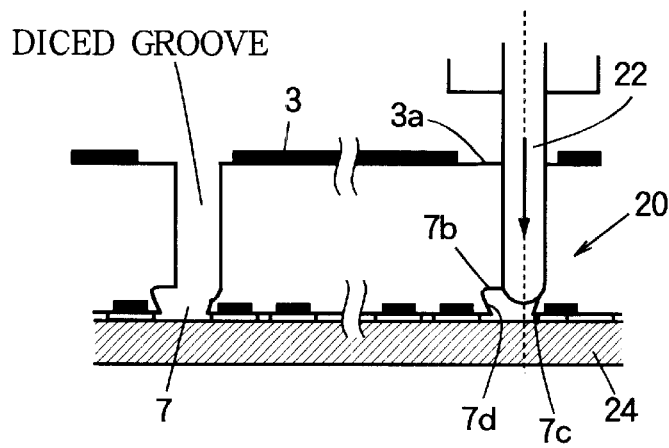
FIGS. 20A and 20B are side views, illustrating the dicing process of the fifth embodiment.
Figure 20B:
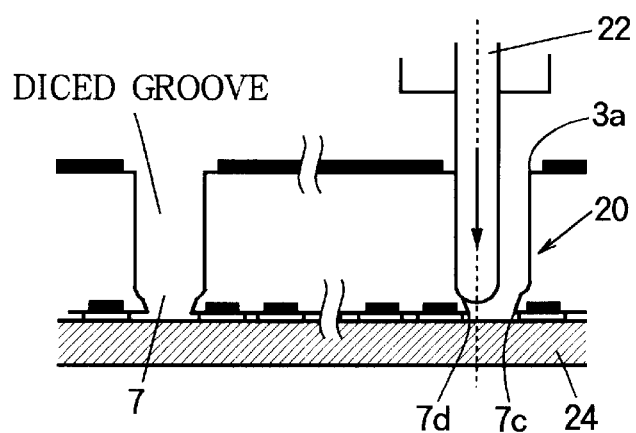

FIGS. 20A and 20B are side views, illustrating the dicing process of the fifth embodiment.

Elements of FIG. 20 similar to those of FIG. 12 have been given the same reference numerals.

The semiconductor wafer 20 has a plurality of LED arrays that are formed thereon and partitioned by separation grooves 7. The semiconductor wafer 20 is attached to the dicing tape 24 with the grooves 7 and the plurality of LED arrays directly facing the dicing tape 24. Then, the semiconductor wafer 20 is fixed on the stage 26 using the fixing jig 25 such that the dicing tape 24 directly faces the stage 26. The dicing apparatus of FIG. 19 differs from that of FIG. 2 in that an infrared CCD camera 27 with a magnifying lens 27a is used in place of the CCD camera 23 with the magnifying lens 23a. The infrared CCD camera 27 shoots from the back surface of the semiconductor wafer 20 to "see through" the opening 3a, thereby detecting the position of the separation groove 7. The opening 3a has a width larger than that of the separation groove 7 so that the infrared CCD camera 27 can easily detect the position of the separation groove 7. The dicing blade 22 and CCD camera 27 move in unison both in the X-direction and in the Y-direction.

The semiconductor wafer 20 is fixedly placed on the stage 21 with the dicing tape 24 directly facing the stage 21 (FIG. 19).

Then, the infrared CCD camera 27 shoots the semiconductor wafer 20 through the opening 3a, thereby locating the position of the separation groove 7 to measure the offset Lf1, i.e., the distance between the optical axis A–A' of the infrared CCD camera 27 and the plane in which the diamond blade 22 rotates (FIG. 19). Also, the stage 21 is rotated in the horizontal plane in fine increments until the grooves 7 extend in directions parallel to the direction in which the diamond blade 22 is horizontally moved.

Then, a maximum vertical stroke of the diamond blade 22 is adjusted such that when the semiconductor wafer 20 is diced, the diamond blade 22 lowers until the diamond blade 22 cuts the semiconductor 20 just past the bottom of the separation groove 7 formed in the semiconductor wafer 20. The diamond blade 22 is moved to a test dicing position near the periphery of the semiconductor wafer 20 where no LED array is formed. Then, a test dicing is performed. Then, the diamond blade 22 is raised from the semiconductor wafer 20 and the infrared CCD camera 27 is by the offset Lf1 in the X-direction to the test dicing position, in order to inspect the diced depth. In this manner, the test dicing is repeated for different dicing depths for a desired depth, thereby setting the diamond blade 22 at a height such that the diamond blade 22 lowers and cuts the semiconductor wafer 20 just past the bottom surface 7b of the separation groove 7.

Then, the semiconductor wafer 20 is diced vertically from the opening 3a to the bottom 7b of the separation groove 7, thereby dicing the LED arrays into individual chips (FIGS. 20A and 20B). First, the infrared CCD camera 27 and the diamond blade 22 are moved in unison until the optical axis A—A of the infrared CCD camera 27 aims at the first cutting position. Then, the diamond blade 22 is moved by the offset Lf1 in the X-direction such that the diamond blade 22 is at the first position where the diamond blade 22 is closer to the top edge 7c than to the top edge 7d.

The rotating diamond blade 22 is lowered vertically from the back surface semiconductor wafer 20 until the cutting edge of the diamond blade 22 reaches the bottom surface 7b of the separation groove 7. The rotating diamond blade 22 is moved also in the Y-direction, along the top edge 7c of the separation groove 7 (FIG. 20A) from where the cutting edge of the diamond blade 22 reaches the bottom surface 7b. Then, the stage 26 is rotated through 180 degrees in the horizontal plane so that the optical axis A—A of the infrared CCD camera 27 aims at the second cutting position where the diamond blade 22 is closer to the top edge 7d of the same separation groove 7 than to the top edge 7c. The rotating diamond blade 22 is again lowered vertically from the back surface of semiconductor wafer 20 until the cutting edge of the diamond blade 22 reaches the bottom surface 7b of the separation groove 7.

The rotating diamond blade 22 is moved also in the Y-direction, along the top edge 7d of the separation groove 7 (FIG. 20B) from where the cutting edge of the diamond blade 22 reaches the bottom surface 7b.

Then, the stage 26 is rotated through 90 degrees in the horizontal plane, so that the diamond blade 22 cuts the semiconductor wafer 20 along a separation groove 7 perpendicular to the separation groove 7 that has been diced. Again, the diamond blade 22 cuts the semiconductor wafer 20 along the separation groove 7 twice; along the top edge 7c, and then along the top edge 7d. Finally, the diced LED chips are raised from the dicing tape 24.

The side surface 12 of the LED array chips according to the fifth embodiment includes the etched surface 12a and the diced surface. The etched surface is at an acute angle with the front surface of the chip. The diced surface 12b is between the etched surface and the back surface of the chip. The diced surface 12b is substantially at right angles with the back surface of the chip so that the chip is generally rectangular. The front surface of the chip and the etched surface 12a come together at an edge 12d to define the outermost dimension of the chip.

The use of the infrared CCD camera 27 allows detecting of the position of the separation groove 7 by seeing through the opening 3a. Thus, the fifth embodiment simplifies the dicing apparatus as opposed to the third embodiment.

Sixth Embodiment

The manufacturing process of an LED array according to a sixth embodiment differs from the fifth embodiment in that a dicing apparatus having a stage with holes formed therein is used for vacuum suction of the semiconductor wafer 20. The LED arrays are formed on the semiconductor wafer 20 just as in the fifth embodiment (see FIGS. 18A and 18B).

The dicing process of the LED arrays of the sixth embodiment will be described in detail.

Figure 21:
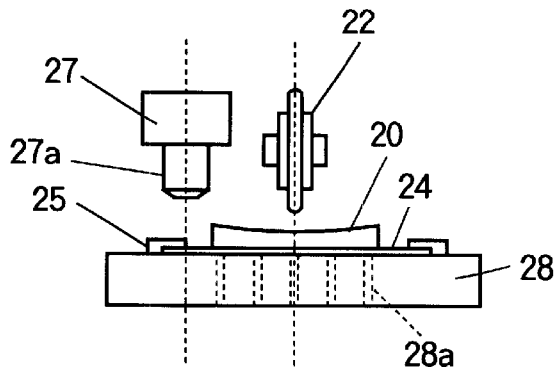
FIG. 21 illustrates a general construction of a dicing apparatus used for dicing the LED arrays of a sixth embodiment.

FIG. 21 illustrates a general construction of a dicing apparatus used for dicing the LED arrays of the sixth embodiment. Elements of FIG. 21 similar to those of FIG. 19 have been given the same reference numerals.

Figure 22A:
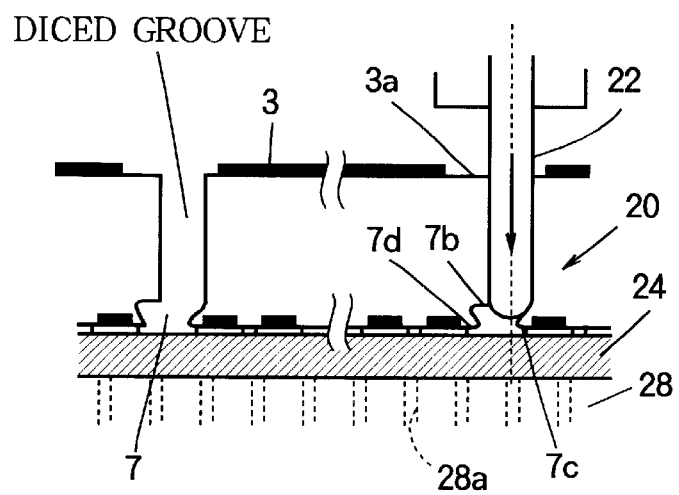
FIGS. 22A and 22B are cross-sectional views, illustrating the manufacturing process of the LED arrays according to the sixth embodiment.
Figure 22B:
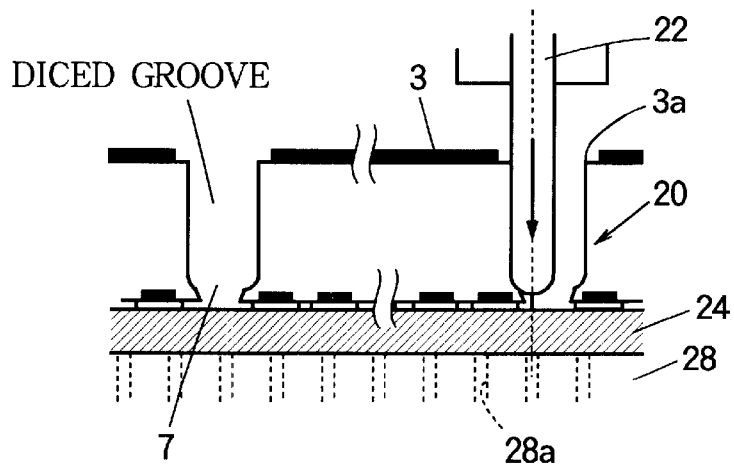

FIGS. 22A and 22B are cross-sectional views, illustrating the manufacturing process of the LED arrays according to the sixth embodiment.

Elements of FIGS. 22A and 22B similar to those of FIGS. 20A and 20B have been given the same reference numerals.

The dicing apparatus of FIG. 21 differs from that of FIG. 19 in that the stage 28 is used in place of the stage 21. The stage 28 has a plurality of holes 28a formed therein for vacuum suction of the semiconductor wafer 20.

The semiconductor wafer 20 is attached to the dicing tape 24 with the grooves 7 and the plurality of LED arrays directly facing the dicing tape 24. Then, the semiconductor wafer 20 is fixed on the stage 28 with the dicing tape 24 directly facing the stage 28. The dicing tape 24 is vacuum-sucked through the holes 28a such that the entire surface of the dicing tape 24 is fixed intimately to the stage 28. The semiconductor wafer 20 usually has a generally concave front surface with a peripheral portion thicker than the middle of the semiconductor wafer 20. The vacuum suction firmly holds the entire front surface of these miconductor wafer 20 in intimate contact with the stage 28 as shown in FIG. 21.

The semiconductor wafer 20 is further held on the stage 28 using the fixing jig 25. The diamond blade 22 is positioned at the first cutting position just as in the fifth embodiment and the semiconductor wafer 20 is then diced vertically from the opening 3a formed on the back surface of the semiconductor wafer 20 to the bottom 7b of the separation groove 7. The rotating diamond blade 22 is moved also in the Y-direction, along the top edge 7c of the separation groove 7 (FIG. 22A) from where the edge of the diamond blade 22 has passed the bottom surface 7b of the separation groove 7. Then, the diamond blade 22 is positioned at the second cutting position and the semiconductor wafer 20 is then diced vertically. The semiconductor wafer 20 is diced also in the Y-direction, along the top edge 7d (FIG. 22B) from where the edge of the diamond blade 22 has passed the bottom surface 7b of the separation groove 7.

Figure 23A:
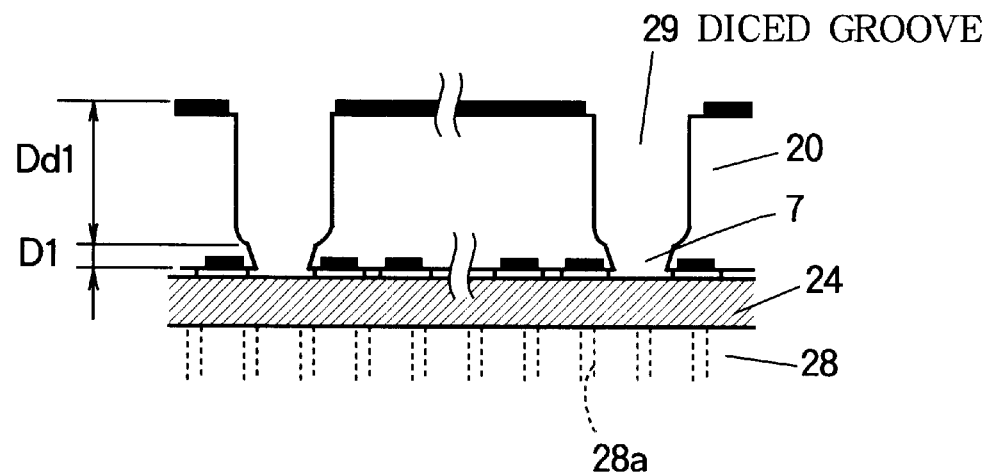
FIGS. 23A and 23B are cross-sectional views of individual chips which have diced from a wafer having a peripheral portion thicker than the middle of the wafer 20, FIG. 23A being a cross-sectional view that illustrates the middle portion of the semiconductor wafer 20 and FIG. 23B being a cross-sectional view that illustrates the peripheral portion of the semiconductor wafer.
Figure 23B:
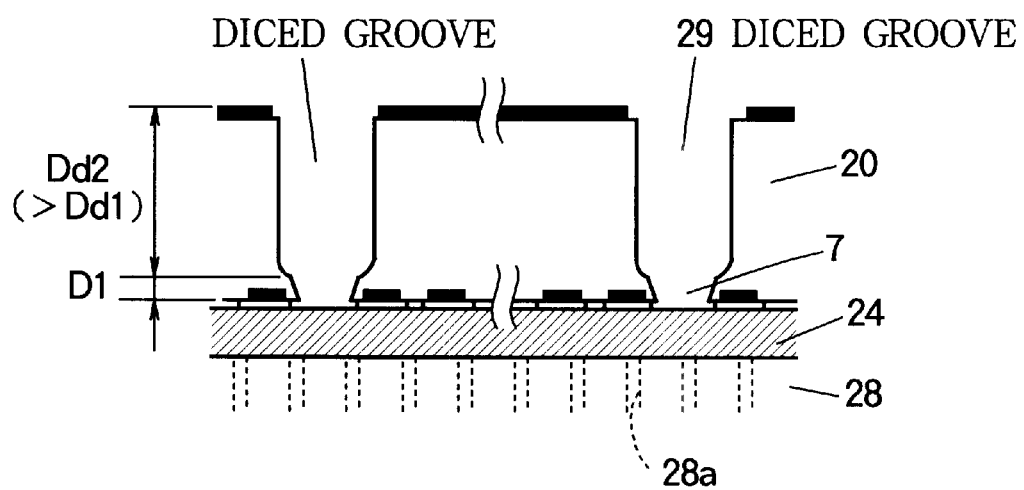

FIGS. 23A and 23B are cross-sectional views of the semiconductor wafer 20 having a peripheral portion thicker than the middle of the wafer 20 after the semiconductor wafer 20 has been diced into individual chips.

FIG. 23A is a cross-sectional view, illustrating the middle portion of the semiconductor wafer 20.

FIG. 23B is a cross-sectional view, illustrating the peripheral portion of the semiconductor wafer.

The dicing of the sixth embodiment is advantageous for the following reason. The semiconductor wafer 20 is attracted to the stage 28 so that the attracted side of the semiconductor wafer 20 becomes configured to the surface of the stage 28, i.e., substantially flat. The semiconductor is diced from the bottom side thereof, which is concaved due to the fact that the semiconductor wafer 20 becomes thicker nearer the peripheral portion. Thus, the diamond blade 22 cuts into the semiconductor wafer 20 at different depths according to the thickness of the semiconductor wafer 20. In other words, the diamond blade 22 cuts deeper into the semiconductor wafer 20 at the peripheral portion of the semiconductor wafer 20 than at the middle portion. Thus, the distance D1 between the front surface of the semiconductor wafer 20 and the bottom of the diced clearance is the same across the semiconductor wafer 20.

The sixth embodiment provides higher dicing accuracy than the fifth embodiment.

The stage 28 having a plurality holes for vacuum suction may also be applied to the first and second embodiments.

Seventh Embodiment

FIGS. 24A–24D are cross-sectional views, illustrating the manufacturing process of an LED array according to a seventh embodiment.

Figure 24A:
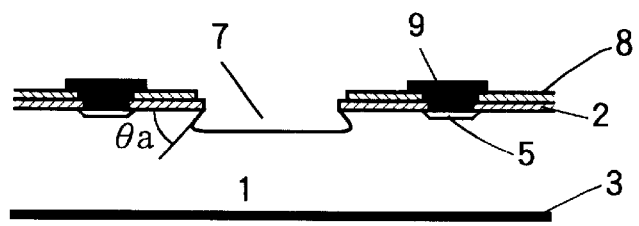
FIGS. 24A and 24B are cross-sectional views of LED arrays according to a seventh embodiment.
Figure 24B:
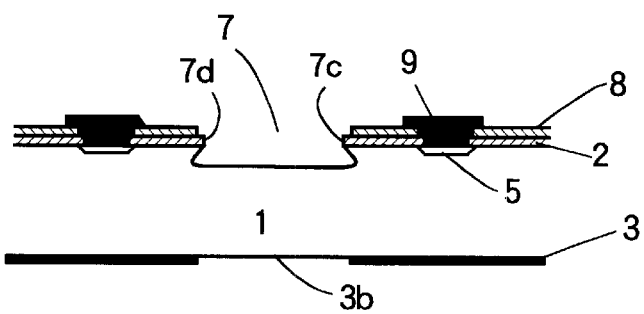

FIGS. 24A and 24B are cross-sectional views of LED arrays formed on a semiconductor wafer.

Figure 24C:
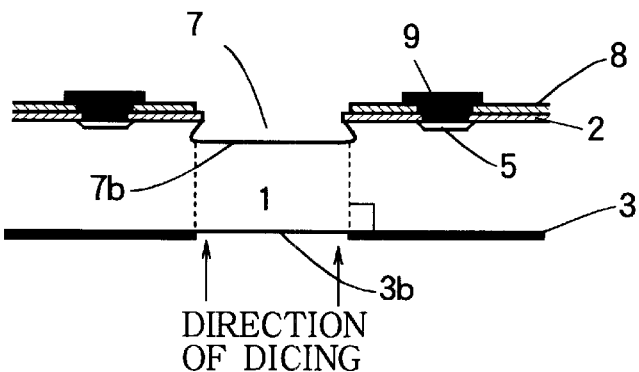
FIGS. 24C and 24D are cross-sectional views, illustrating the dicing process in which the LED arrays are diced into individual chips.
Figure 24D:
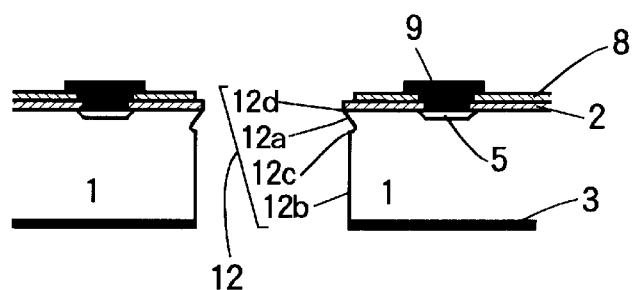

FIGS. 24C and 24D are cross-sectional views, illustrating the dicing process in which the LED arrays are diced into individual chips.

Elements of FIGS. 24A–24D similar to those of FIG. 18 have been given the same reference numerals.

As shown in FIG. 24A, just as in the fifth embodiment (FIG. 18A) the separation grooves 7 are formed in the front surface of an n-type substrate 1, the separation grooves 7 being formed in areas through which the LED arrays are cut into individual chips. For simplicity, FIGS. 24A and 24B show only two separation grooves 7. The separation groove 7 has side walls that make acute angles θa with the front surface of the n-type substrate 1. A p-type diffusion region (light emitting elements) 5 is formed in the LED array region.

As shown in FIG. 24A, an area of the n-side electrode (common electrode) 3 that opposes the separation groove 7 is removed by photolithography and etching, thereby forming an opening 3a through which the n-type substrate 1 is exposed. For example, the opening 3a has a width larger than the distance between the top edge 7c and 7d and narrower than the maximum width of the separation groove 7.

As shown in FIGS. 24C and 24D, the n-type substrate 1 is diced vertically from the opening 3b formed in the back surface of the n-type substrate 1 to the bottom surface 7b of the separation groove 7 near the front surface of the n-type substrate 1. The n-type substrate 1 is diced also in a horizontal direction along the opening 3b, thereby cutting the LED arrays into individual chips. A side surface 12 of the LED array chip of the seventh embodiment is the same as that of the fifth embodiment. The side surface 12 includes the etched surface 12a and the diced surface 12b. The etched surface 12a is at an acute angle with the front surface of the chip, and the diced surface 12b is substantially at a right angle with the back surface of the chip. The front surface of the chip and the etched surfaces 12a come together at the edge 12d to define the outermost dimension of the chip.

The dicing process of the LED arrays according to the seventh embodiment will now be described in detail with reference to FIG. 25.

Figure 25A:
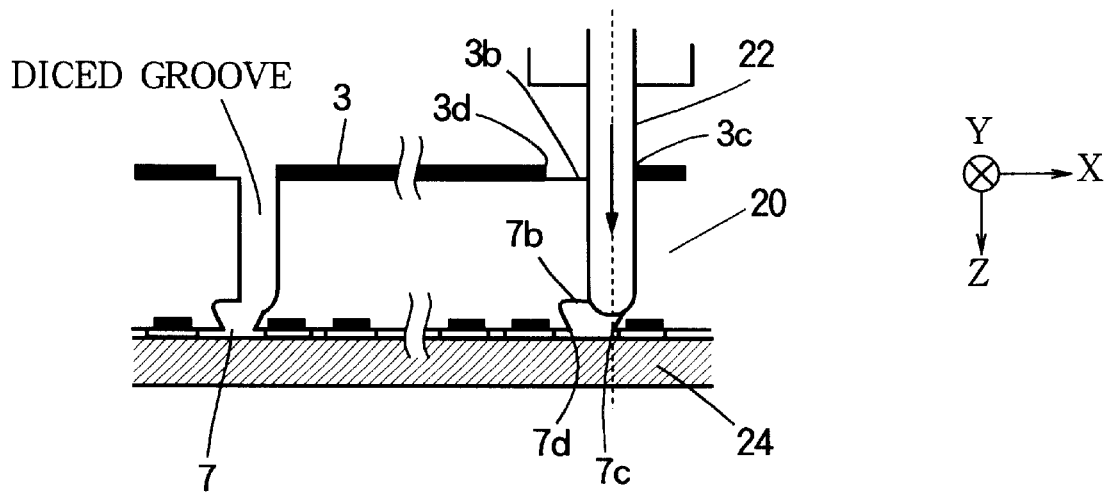
FIGS. 25A and 25B are cross-sectional views, illustrating the dicing process of the LED array of the seventh embodiment.
Figure 25B:
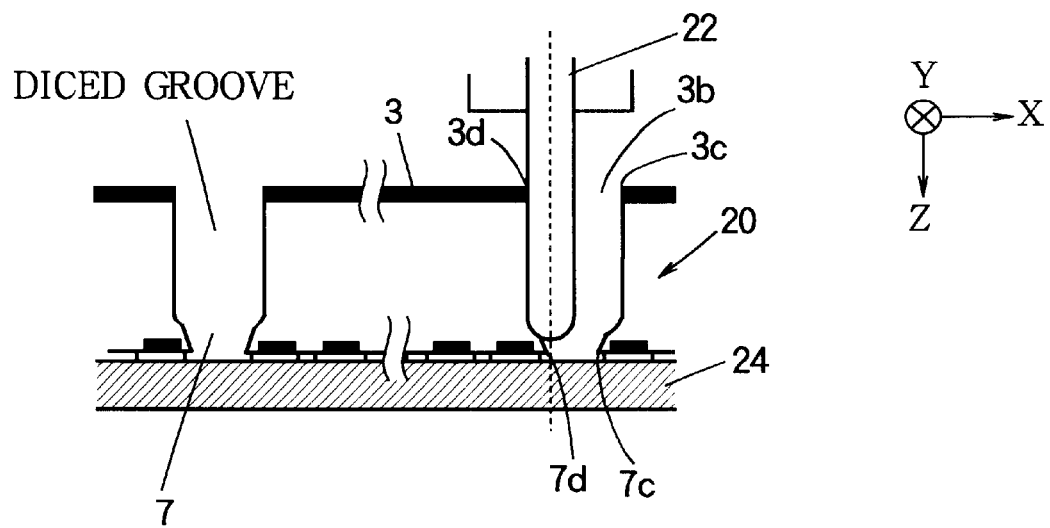
Figure 26A:
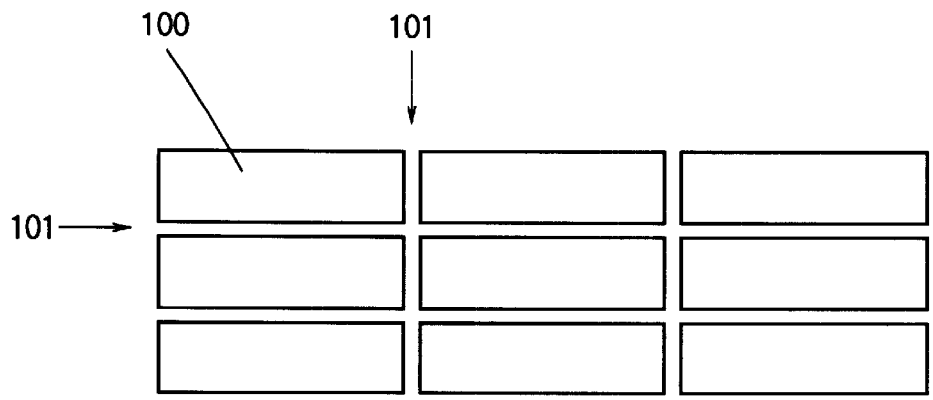
FIG. 26A is a top view of a conventional LED array on which a plurality of LED arrays are formed.
Figure 26B:
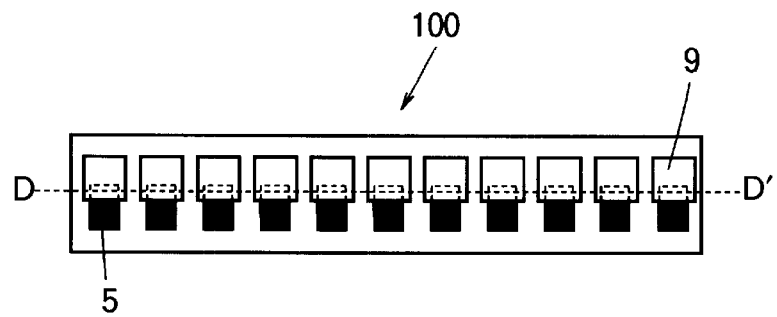
FIG. 26B is a top view of one of the conventional LED arrays after the semiconductor wafer has been diced.
Figure 26C:
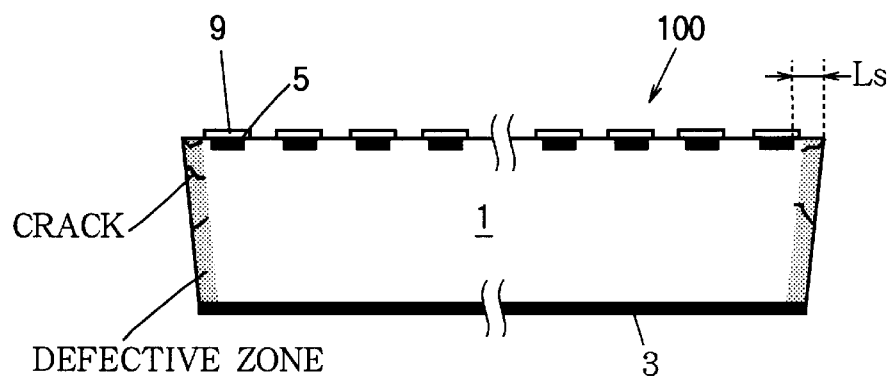
FIG. 26C is a cross-sectional view of the LED array taken along lines D–D' of FIG. 26B.
Figure 27A:
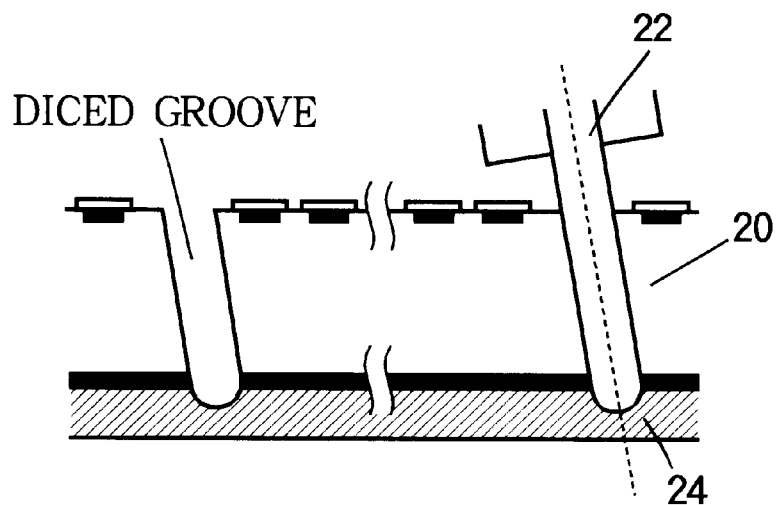
FIGS. 27A and 27B illustrate the steps of the dicing process of the conventional LED array when the conventional LED array is diced.
Figure 27B:
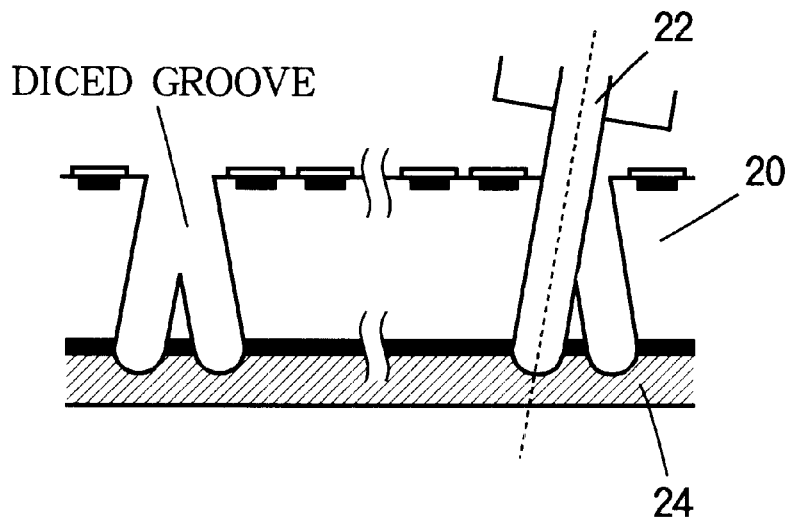

FIGS. 25A and 25B are cross-sectional views, illustrating the dicing process of the LED array of the seventh embodiment. Elements of FIGS. 25A and 25B similar to those of FIGS. 20A and 20B have been given the same reference numerals. The dicing process of the seventh embodiment uses the same dicing apparatus as is use in the first embodiment (FIG. 2).

The semiconductor wafer 20 is attached to the dicing tape 24 with the dicing tape 24 directly facing the front surface of the semiconductor wafer 20. Using the fixing jig 25, the semiconductor wafer 20 is then fixedly mounted on the stage 21 with the dicing tape 24 directly facing the stage 21. The CCD camera 23 shoots the back surfaced of the semiconductor wafer 20 to detect the position of the opening 3b. The opening 3b and the separation groove 7 are aligned with each other such that the perimeter of the opening 3b serves as a target dicing pattern. In other words, the diamond blade 22 cuts at the perimeter of the opening 3b into the semiconductor wafer 20.

Then, just as in the first to sixth embodiments, the diamond blade 22 is first placed at the first cutting position where the diamond blade 22 is closer to the top edge 7c than to the top edge 7d. The rotating diamond blade 22 is lowered from the back surface semiconductor wafer 20 until the diamond blade 22 reaches the bottom surface 7b of the separation groove 7. The rotating diamond blade 22 is moved also in the Y-direction, along the top edge 7c of the separation groove 7 (FIG. 25A) from where the diamond blade 22 reaches the bottom surface 7b. Then, the stage 21 is horizontally rotated through 180 degrees so that the diamond blade 22 is at the second cutting position where the diamond blade 22 is closer to the top edge 7d of the same separation groove 7 than to the top edge 7c. The rotating diamond blade 22 is lowered in the Z-direction from the back surface of the semiconductor wafer 20 until the diamond blade 22 reaches the bottom surface 7b of the separation groove 7. The rotating diamond blade 22 is moved also in the Y-direction, along the top edge 7d of the separation groove 7 (FIG. 25B) from where the diamond blade 22 reaches the bottom surface 7b.

Then, the stage 21 is rotated though 90 degrees in the horizontal plane, so that the diamond blade 22 cuts the semiconductor wafer 20 along a separation groove 7 perpendicular to the separation groove 7 that has been diced. The diamond blade 22 cuts the semiconductor wafer 20 along the separation groove 7 twice; along the top edge 7c, and then along the top edge 7d. Finally, the diced LED chips are removed from the dicing tape 24.

Just as the third embodiment, the side surface 12 of the LED array chip of the seventh embodiment includes the etched surface 12a and the diced surface 12b. The etched surface 12a is at an acute angle with the front surface of the chip. The diced surface 12b extends from the etched surface 12a to the back surface of the chip. The diced surface 12b makes substantially a right angle with the back surface of the chip on which the common electrode 3 is formed. Thus, the cross section of the chip is a rectangle. The outermost dimension of the chip is defined by the edge 12d where the etched surface 12a and the front surface of the chip come together.

Forming the opening in the common electrode on the back surface of the semiconductor wafer allows use of a dicing apparatus having a general purpose CCD camera.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An LED array chip comprising:
   a semiconductor substrate having a front surface forming a first plate in which a row of light emitting elements are formed; and
   a side surface having a first surface which makes an acute angle with the front surface, and a second surface that extends from the first surface away from the front surface and extending through the substrate to make one of a substantially right angle and an acute angle, the first surface and second surface being discontinuous with each other;

wherein the first surface joins with the front surface to define an end of the chip, and the second surface is spaced by at least a predetermined distance from a second plane generally perpendicular to the first plane extending through the end of the chip.

2. The LED array chip according to claim 1, wherein the end of the chip defines an outermost dimension of the chip.

3. The LED array chip according to claim 1, wherein said first surface extends further away from the front surface than a depth of the light emitting elements.

4. The LED array chip according to claim 1, wherein said semiconductor substrate has a back surface that opposes said front surface, and wherein the second surface extends from the first surface to the back surface and makes one of a substantially right angle and an obtuse angle with the back surface.

5. The LED array chip according to claim 4, wherein the obtuse angle is given by $\theta b \leq 180° - \theta a$, where $\theta a$ is the acute angle.

6. An LED array chip comprising:

a semiconductor substrate having a front surface forming a first plane in which a row of light emitting elements are formed; and a side surface having a first surface which makes a first angle with the front surface, and a second surface that extends from the first surface away from the front surface and extending through the substrate to make a second angle with the first plane, the first angle being an acute angle and the second angle being one of a substantially right angle and an acute angle, the first angle being different from the second angle;

wherein the first surface joins with the front surface to define an end of the chip, and the second surface is spaced by at least a predetermined distance from a second plane generally perpendicular to the first plane extending through the end of the chip.

7. The LED array chip according to claim 6, wherein the end of the chip defines an outermost dimension of the chip.

8. The LED array chip according to claim 6, wherein said first surface extends further away from the front surface than a depth of the light emitting elements.

9. The LED array chip according to claim 6, wherein said semiconductor substrate has a back surface that opposes said front surface, and wherein the second surface extends from the first surface to the back surface and makes one of a substantially right angle and an obtuse angle with the back surface.

10. The LED array chip according to claim 9, wherein the obtuse angle is given by $\theta b \leq 180° - \theta a$, where $\theta a$ is the acute angle.

* * * * *